(12) United States Patent
Chan et al.

(10) Patent No.: US 9,082,984 B2
(45) Date of Patent: Jul. 14, 2015

(54) METHOD FOR DISPERSING CARBON NANOTUBES USING CHONDROITIN SULFATE CATION SALT

(71) Applicant: Nanyang Technological University, Singapore (SG)

(72) Inventors: Bee Eng Mary Chan, Singapore (SG); Liangyu Yan, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 13/914,367

(22) Filed: Jun. 10, 2013

(65) Prior Publication Data

US 2013/0341570 A1 Dec. 26, 2013

Related U.S. Application Data

(63) Continuation of application No. 13/824,236, filed as application No. PCT/SG2011/000321 on Sep. 19, 2011, now abandoned.

(60) Provisional application No. 61/383,905, filed on Sep. 17, 2010.

(51) Int. Cl.
| | | |
|---|---|---|
| *H01B 1/24* | (2006.01) | |
| *H01B 1/04* | (2006.01) | |
| *H01L 51/00* | (2006.01) | |
| *B82Y 10/00* | (2011.01) | |
| *B82Y 40/00* | (2011.01) | |
| *C08L 5/08* | (2006.01) | |
| *H01L 51/05* | (2006.01) | |
| *C01B 31/02* | (2006.01) | |
| *B82Y 30/00* | (2011.01) | |

(52) U.S. Cl.
CPC .............. *H01L 51/0048* (2013.01); *B82Y 10/00* (2013.01); *B82Y 30/00* (2013.01); *B82Y 40/00* (2013.01); *C01B 31/0273* (2013.01); *C08L 5/08* (2013.01); *H01L 51/0049* (2013.01); *H01L 51/0558* (2013.01)

(58) Field of Classification Search
CPC .................................... H01B 1/24; H01B 1/04
USPC ......................................... 252/509, 506, 510
See application file for complete search history.

(56) References Cited

U.S. PATENT DOCUMENTS

| | | | | |
|---|---|---|---|---|
| 8,481,017 | B2 * | 7/2013 | Schlenoff et al. ........... | 424/78.08 |
| 2005/0277675 | A1 | 12/2005 | Fuugetsu | |
| 2005/0282925 | A1 * | 12/2005 | Schlenoff et al. .............. | 523/106 |
| 2006/0051401 | A1 * | 3/2006 | Manohar et al. ............... | 424/443 |
| 2010/0173228 | A1 * | 7/2010 | Wallace et al. ................. | 429/532 |
| 2010/0296226 | A1 * | 11/2010 | Nanba et al. ................... | 361/502 |
| 2011/0198543 | A1 * | 8/2011 | Tarumoto et al. ............. | 252/511 |
| 2012/0058889 | A1 * | 3/2012 | Nishino et al. ................ | 502/328 |

FOREIGN PATENT DOCUMENTS

| | | |
|---|---|---|
| JP | 2006-292495 A | 10/2006 |
| WO | 2005/075663 A2 | 8/2005 |
| WO | 2008/000045 A1 | 1/2008 |
| WO | 20091035912 A2 | 3/2009 |
| WO | WO 2010041750 A1 * | 4/2010 |
| WO | WO 2010101205 A1 * | 9/2010 |

OTHER PUBLICATIONS

Chondroitin sulfate, Wikipedia (English), Dec. 16, 2013, pp. 1-10.*
Arnold et al., "Sorting carbon nanotubes by electronic structure using density differentiation," Nature Nanotechnology 1: 60-65, Oct. 2006.
Bachilo et al., "Structure-Assigned Optical Spectra of Single-Walled Carbon Nanotubes," Science 298: 2361-2366, Dec. 20, 2002.
Baskaran et al., "Noncovalent and Nonspecific Molecular Interactions of Polymers with Multiwalled Carbon Nanotubes," Chem. Mater. 17: 3389-3397, 2005.
Baughman et al., "Carbon Nanotubes—the Route Toward Applications," Science 297: 787-791, Aug. 2, 2002.
Cao et al., "Random Networks and Aligned Arrays of Single-Walled Carbon Nanotubes for Electronic Device Applications," Nano Res 1: 259-272, 2008.
Case et al., "AMBER 9 Users' Manual," University of California, San Francisco, 2006, 328 pages.
Chen et al., "Toward the Extraction of Single Species of Single-Walled Carbon Nanotubes Using Fluorene-Based Polymers," Nano Letters 7(10): 3013-3017, 2007.
Darden et al., "Particle mesh Ewald: An N-log(N) method for Ewald sums in large systems," J. Chem. Phys. 98(12): 10089-10092, Jun. 15, 1993.
Dieckmann et al., "Controlled Assembly of Carbon Nanotubes by Designed Amphiphilic Peptide Helices," J. Am. Chem. Soc. 125: 1770-1777, 2003.

(Continued)

*Primary Examiner* — Douglas McGinty
(74) *Attorney, Agent, or Firm* — Seed IP Law Group PLLC

(57) ABSTRACT

The present invention relates to a method for dispersing carbon nanotubes. The method may include contacting the carbon nanotubes with a solution containing chondroitin sulfate cation salt of formula (I) wherein $R_1$ is $MSO_3$ and $R_2$ is H, or $R_1$ is H and $R_2$ is $MSO_3$; M is an alkaline metal, or an alkaline earth metal further bound to a monovalent counter-anion; n is at least 20.

17 Claims, 26 Drawing Sheets

(56) References Cited

OTHER PUBLICATIONS

Gao et al., "Simulation of DNA-Nanotube Interactions," Annu. Rev. Mater. Res. 34: 123-150, 2004.

Hertel et al., "Spectroscopy of Single- and Double-Wall Carbon Nanotubes in Different Environments," Nano Letters 5 (3): 511-514, 2005.

Hess et al., "LINCS: A Linear Constraint Solver for Molecular Simulations," Journal of Computational Chemistry 18(12): 1463-1472, 1997.

Homma et al., "Suspended single-wall carbon nanotubes: synthesis and optical properties," Rep. Prog. Phys. 72: 066502, 2009. (22 pages).

Iijima, "Helical microtubules of graphic carbon," Nature 354: 56-58, Nov. 7, 1991.

Itkis et al., "Comparison of Analytical Techniques for Purity Evaluation of Single-Walled Carbon Nanotubes," J. Am. Chem. Soc. 127: 3439-3448, 2005.

Jorgensen et al., "Comparsion of simple potential functions for simulating liquid water," J. Chem. Phys. 79(2): 926-935, Jul. 15, 1983.

Lee et al., "Solution-Processable Carbon Nanotubes for Semiconducting Thin-Film Transistor Devices," Adv. Mater. 22: 1278-1282, 2010.

Mobley et al., "On the use of orientational restraints and symmetry corrections in alchemical free energy calculations," The Journal of Chemical Physics 125: 084902-1, 2006. (16 pages).

Moulton et al., "Biomolecules as selective dispersants for carbon nanotubes," Carbon 43: 1879-1884, 2005.

Nish et al., "Highly selective dispersion of single-walled carbon nanotubes using aromatic polymers," Nature Nanotechnology 2: 640-646, Oct. 2007.

Onufriev et al., "Exploring Protein Native States and Large-Scale Conformational Changes With a Modified Generalized Born Model," PROTEINS: Structure, Function, and Bioinformatics 55: 383-394, 2004.

Opatkiewicz et al., "Nanotubes on Display: How Carbon Nanotubes Can Be Integrated into Electronic Displays," ACS Nano 4(6): 2975-2978, 2010.

Sinani et al., "Aqueous Dispersions of Single-wall and Multiwall Carbon Nanotubes with Designed Amphiphilic Polycations," J. Am. Chem. Soc. 127: 3463-3472, 2005.

Star et al., "Starched Carbon Nanotubes," Angew. Chem. Int. Ed. 41(14): 2508-2512, 2002.

Van Der Spoel et al., "GROMACS: Fast, Flexible, and Free," J Comput Chem 26: 1701-1718, 2005.

Yan et al., "Individually Dispersing Single-Walled Carbon Nanotubes with Novel Neutral pH Water-Soluble Chitosan Derivatives," J. Phys. Chem. C 112: 7579-7587, 2008.

Yan et al., "Use of a Chondroitin Sulfate Isomer as an Effective and Removable Dispersant of Single-Walled Carbon Nanotubes," small 7(19): 2758-2768, 2011.

Yi et al., "Wrapping of Single-Walled Carbon Nanotubes by a $\pi$-Conjugated Polymer: The Role of Polymer Conformation-Controlled Size Selectivity," J. Phys. Chem. B 112: 12263-12269, 2008.

Zheng et al., "DNA-assisted dispersion and separation of carbon nanotubes," Nature Materials 2: 338-342, May 2003.

\* cited by examiner

| CS-A | | | | |
|---|---|---|---|---|
| | | 180-260 nm | 185-260 nm | 190-260 nm |
| | Helix | n.d. | n.d. | 24.2% |
| | Antiparallel | n.d. | n.d. | 7.0% |
| | Parallel | n.d. | n.d. | 15.1% |
| | Beta-Turn | n.d. | n.d. | 15.7% |
| | Rndm. Coil | n.d. | n.d. | 60.7% |
| | Total Sum | - | - | 122.6% |

| CS-B | | | | |
|---|---|---|---|---|
| | | 180-260 nm | 185-260 nm | 190-260 nm |
| | Helix | n.d. | n.d. | 27.4% |
| | Antiparallel | n.d. | n.d. | 9.2% |
| | Parallel | n.d. | n.d. | 11.5% |
| | Beta-Turn | n.d. | n.d. | 16.5% |
| | Rndm. Coil | n.d. | n.d. | 46.0% |
| | Total Sum | - | - | 110.5% |

| CS-C | | | | |
|---|---|---|---|---|
| | | 180-260 nm | 185-260 nm | 190-260 nm |
| | Helix | n.d. | n.d. | 16.6% |
| | Antiparallel | n.d. | n.d. | 30.2% |
| | Parallel | n.d. | n.d. | 15.7% |
| | Beta-Turn | n.d. | n.d. | 19.3% |
| | Rndm. Coil | n.d. | n.d. | 54.7% |
| | Total Sum | - | - | 136.5% |

| Atom | Atomic concentration (%) | | |
|---|---|---|---|
| | SDS/Hipco | CS-A/Hipco | CS-C/Hipco |
| O | 26.92 | 28.93 | 17.09 |
| C | 69.57 | 67.49 | 78.58 |
| N | 3.47 | 3.52 | 4.26 |
| Na | 0 | 0 | 0 |
| S | 0.04 | 0.06 | 0.07 |

(B)

| (n, m) | Diameter (nm) | Chiral Angle (Deg) | $E_B$ (kcal/mol) | | |
|---|---|---|---|---|---|
| | | | Hipco/CS-A | Hipco/CS-B | Hipco/CS-C |
| (7,5) | 0.829 | 24.5 | -92.6±4.4 | -83.8±5.6 | -91.8±4.1 |
| (8,4) | 0.84 | 19 | -89.2±4.1 | -85.3±4.8 | -89.9±4.5 |
| (10,2) | 0.884 | 9 | -89.5±4.2 | -86.5±5.2 | -93.5±4.5 |
| (7,6) | 0.895 | 27.5 | -93.5±4.1 | -86.1±5.3 | -93.5±4.3 |
| (9,4) | 0.916 | 17.5 | -92.3±4.0 | -85.2±4.8 | -93.5±4.7 |
| (8,6) | 0.966 | 25 | -93.1±4.3 | -86.1±5.5 | -95.2±4.2 |

FIGURE 10

| (n, m) | Diameter (nm) | Chiral Angle (Deg) | Calc. Inten. Factor* | Relative PL Peak intensity % Abundance | | | | Calibrated PL intensity % Abundance | | | |
|---|---|---|---|---|---|---|---|---|---|---|---|
| | | | | Hipco/ SDS | Hipco/ CS-A | Hipco/ CS-B | Hipco/ CS-C | Hipco/ SDS | Hipco/ CS-A | Hipco/ CS-B | Hipco/ CS-C |
| (6,5) | 0.757 | 27 | 0.67 | 9.2% | 4.3±2.5 | 6.8±1.2 | 4.1±3.8 | 7.5% | 3.0±2.3 | 5.9±1.0 | 3.7±3.5 |
| (7,5) | 0.829 | 24.5 | 0.71 | 0 | 8.0±3.7 | 6.9±1.8 | 7.3±5.9 | 0 | 6.5±3.3 | 5.7±1.5 | 6.2±5.1 |
| (8,4) | 0.84 | 19 | 0.46 | 7.1% | 16.0±2.2 | 12.0±4.7 | 11.5±1.6 | 8.4% | 19.8±2.0 | 15.0±5.6 | 14.8±2.3 |
| (10,2) | 0.884 | 9 | 2.38 | 13.7% | 14.6±1.9 | 12.9±3.9 | 17.3±2.6 | 3.25 | 3.5±0.6 | 3.2±1.1 | 4.3±0.7 |
| (7,6) | 0.895 | 27.5 | 0.47 | 19.1% | 18.9±1.3 | 20.7±1.8 | 19.5±2.2 | 22.2% | 22.9±1.3 | 25.6±1.5 | 24.5±2.3 |
| (9,4) | 0.916 | 17.5 | 0.70 | 27.2% | 30.2±3.1 | 24.3±1.4 | 21.2±3.9 | 21.3% | 16.4±2.1 | 20.1±0.7 | 17.9±3.0 |
| (10,3) | 0.936 | 13 | 0.28 | 7.9% | 0 | 0 | 0 | 15.4% | 0 | 0 | 0 |
| (8,6) | 0.966 | 25 | 0.49 | 10.7% | 9.9±1.0 | 9.7±2.6 | 11.9±1.8 | 12.0% | 11.5±1.0 | 11.6±3.4 | 14.3±1.9 |
| (9,5) | 0.976 | 21 | 0.28 | 5.1% | 0 | 0 | 0 | 10.0% | 0 | 0 | 0 |
| (8,7) | 1.032 | 27.8 | 0.30 | 0 | 8.4±1.9 | 6.6±1.0 | 7.3±2.4 | 0 | 15.8±3.0 | 12.9±2.4 | 14.3±4.3 |

*calculated intensity factor

FIGURE 16

METHOD FOR DISPERSING CARBON NANOTUBES USING CHONDROITIN SULFATE CATION SALT

CROSS-REFERENCE TO RELATED APPLICATION

This application is a continuation of U.S. patent application Ser. No. 13/824,236, now abandoned, filed Mar. 15, 2013, which is a U.S. national phase application of PCT/SG2011/000321, filed Sep. 19, 2011, which claims the benefit of priority of U.S. Provisional Patent Application No. 61/383,905, filed Sep. 17, 2010, the contents of which being hereby incorporated by reference in its entirety for all purposes.

TECHNICAL FIELD

The invention relates to a method of dispersing carbon nanotubes, and in particular, to a method of dispersing single-walled carbon nanotubes using chondroitin sulfate.

BACKGROUND

Single-walled carbon nanotubes (SWNTs) possess excellent mechanical, optical and electrical properties, and have been proposed for use in a wide range of applications. However, as-produced SWNTs are aggregated due to strong van der Waals interactions between individual tubes.

Furthermore, as-produced SWNTs typically consist of mixtures of metallic and semiconducting species with different diameters and chiral angles. Their poor solubility in water and the presence of metallic tubes hinder to a certain extent their use in applications such as field effect transistors (FETs).

Therefore, there is a need to reduce aggregation and to disperse the carbon nanotubes as individual tubes.

SUMMARY

According to one aspect, there is provided a method for dispersing carbon nanotubes. The method includes:
(a) providing a solution containing chondroitin sulfate cation salt of formula (I)

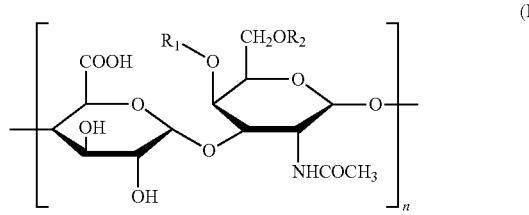

wherein
$R_1$ is $MSO_3$ and $R_2$ is H, or $R_1$ is H and $R_2$ is $MSO_3$;
M is an alkaline metal, or an alkaline earth metal further bound to a monovalent counter-anion;
n is at least 20; and
(b) contacting the carbon nanotubes with the solution containing the chondroitin sulfate cation salt.

In another aspect, the invention relates to the use of a chondroitin sulfate cation salt of formula (I) for dispersing carbon nanotubes.

A further aspect relates to a chondroitin sulfate cation salt of formula (I) for use as a dispersant for carbon nanotubes.

In yet another aspect, a carbon nanotube having the present chondroitin sulfate cation salt of formula (I) attached thereto is provided.

BRIEF DESCRIPTION OF THE DRAWINGS

In the drawings, like reference characters generally refer to the same parts throughout the different views. The drawings are not necessarily drawn to scale, emphasis instead generally being placed upon illustrating the principles of various embodiments. In the following description, various embodiments of the invention are described with reference to the following drawings.

FIG. 3 shows the deconvolution results of CD spectra with CDNN software.

FIG. 10 shows (A) XPS results of HiPco SWNT solutions with SDS and CS-A, and (B) the binding energies of different CS-SWNT complexes estimated by GB model.

FIG. 16 shows the relative PLE intensities of identified semiconducting species in HiPco-SWNT solutions with CS-A, CS-B and CS-C isomers.

DESCRIPTION

Figure 1:
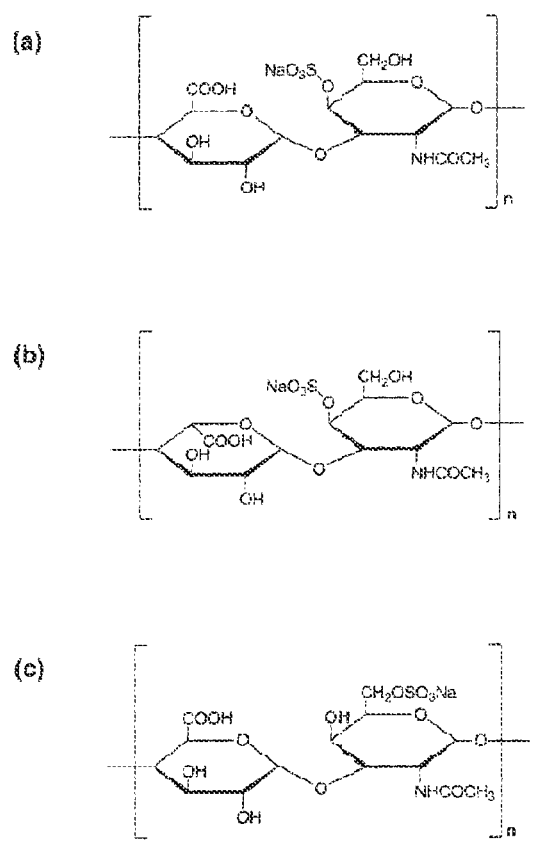
FIG. 1 shows isomers of chondroitin sulfate (CS) (a) CS-A (b) CS-B, and (c) CS-C.

The following detailed description refers to the accompanying drawings that show, by way of illustration, specific details and embodiments in which the invention may be practised. These embodiments are described in sufficient detail to enable those skilled in the art to practise the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Various embodiments provide for a method for dispersing carbon nanotubes. The carbon nanotubes may be dispersed in water, for example. The carbon nanotubes may be contacted with a solution containing chondroitin sulfate cation salt (or chondroitin sulfate, for short). The chondroitin sulfate wraps around individual carbon nanotube and prevent aggregation of the carbon nanotubes.

A carbon nanotube as used in various embodiments may be a cylinder of rolled up graphitic sheets. Single-, double- and multi-walled carbon nanotubes are known. The carbon nanotubes may be of any desired length, such as in the range from about 0.1 nm to about 10 μm, such as from about 1 nm to about 5 μm or from 10 nm to about 1 m. In various embodiments, the carbon nanotubes may have a length of at most about 2 μm or a length in the range from about 0.5 μm to about 2 μm or from about 1 μm to about 2 μm. The conductivity of the carbon nanotubes used may be freely selected according to any specific requirements. Depending on the arrangement of the carbon hexagon rings along the surface of the nanotubes, carbon nanotubes can be metallic or semiconducting.

Carbon nanotubes exist in different forms, such as single-walled carbon nanotubes (SWNT), double-walled carbon nanotubes (DWNT), multi-walled carbon nanotubes (MWNT), or modified multi-walled carbon nanotubes. Although various embodiments described herein relate to SWNT, it is to be understood and appreciated that other forms or configurations of the carbon nanotubes may also be useful.

A SWNT is a seamless cylinder formed from one graphite layer. For example, carbon nanotubes can be described as a graphite plane (so called graphene) sheet rolled into a hollow cylindrical shape so that the structure is one-dimensional with axial symmetry, and in general exhibiting a spiral conformation, called chirality. A single-wall nanotube can be defined by a cylindrical sheet with a diameter of about 0.7 to about 20 nm, such as about 1 to about 20 nm.

A DWNT has two layers of graphite sheets rolled in to form a tube shape. The two layers of graphite sheets can form a concentric cylinder. The nanotubes are considered as a cross between SWNT and MWNT as they can have the electronic properties of the SWNT, and the mechanical strength of MWNT. DWNT may be semi-conducting or metallic.

A MWNT has multiple layers of graphite rolled in on to form a tube shape. The nanotubes can also exist in forms in which they have hydrophilic groups such as hydroxyl group, pyrenes, esters, thiols, amines, a carboxyl group and mixtures thereof on their surface.

Carbon nanotubes may be prepared by several different methods known in the art. For example, SWNT may be grown by carbon monoxide (CO) disproportionation (decomposition into C and $CO_2$) at 700-950° C. in flow of pure CO at a total pressure that typically ranges from 1 to 10 atm using a catalyst comprising cobalt (Co) and molybdenum (Mo) on a mesoporous silica support, leading to so-called CoMoCAT® SWNTs. Using this method, diameter control of SWNTs can be achieved. Another possibility is the synthesis using high pressure carbon monoxide (HiPco) leading to so-called HiPco SWNTs. Generally, in a HiPco method, metal catalyst is formed in situ when $Fe(CO)_5$ or $Ni(CO)_4$ is injected into a reactor along with a stream of CO gas at a temperature range of about 900-1100° C. at a pressure of about 30 to 50 atm. The metal catalyst formed can be in the form of nanometer sized particles. HiPco SWNTs may be produced following the disproportionation of CO by the metal catalyst particles. In various embodiments, CoMoCAT® and HiPco SWNTs were used to demonstrate the viability of the method described herein.

As-synthesized SWNTs contain mixtures of metallic and semiconducting species with different diameters and chiral angles. Semiconducting SWNTs are known to exhibit superior field-effect behavior, for example. To minimize the effect of tube-to-tube variation on device electronic properties, networks of SWNTs, rather than individual nanotubes, have been applied in producing field effect transistors (FETs). FETs employing SWNT networks (SWNTnets) in the active channels are quite reproducible and printable, making low-cost macro-electronics possible. SWNTnet-based FETs have achieved mobilities higher than those typically achieved with semiconducting polymers. However, the presence of metallic tubes in SWNTnets impairs or destroys the switching behavior of semiconducting tubes. There exist numerous approaches to separate semiconducting SWNTs from metallic SWNTs. These strategies include the synthetic strategy of selective growth, post-synthesis solution-based separation methods (such as electrophoretic separation, dielectrophoresis, chromatography, density gradient ultracentrifugation (DGU), gel-based separation techniques, selective aromatic extraction, surfactant extraction, amine extraction, surface alignment and selective polymer wrapping) and fabrication-based techniques such as electrical breakdown of metallic nanotubes. However, many of the proposed methods do not achieve full semiconductor device yield, or do involve substantial costs.

Selective functionalizations of SWNTs using small aromatic molecules which can strongly interact with SWNTs via π-π stacking interaction, have been used for selective separation of SWNTs. Such molecules include diazonium salts, pyrene derivatives, porphyrine derivatives, pentacene derivatives and flavin mononucleotide. However, most separation techniques are still insufficient to remove metallic SWNTs to an extent sufficient to meet the requirements for electronic devices.

The present method may be used to disperse carbon nanotubes, for example SWNTs, into individual nanotubes or small bundles, instead of being in an entangled mass, prior to forming SWNTnets, and in particular SWNTnets consisting essentially of semiconducting species.

Chondroitin sulfate is a sulfated glycosaminoglycan (GAG) composed of a chain of alternating sugars (N-acetyl-galactosamine and glucuronic acid). It is usually found attached to proteins as part of a proteoglycan. A chondroitin chain can have over 100 individual sugars, each of which can be sulfated in variable positions and quantities. Chondroitin sulfate thus exists in various isomeric forms. It has been found that only certain isomeric forms of chondroitin sulfate are able to effectively wrap around the nanotubes. In the present method, chondroitin sulfate cation salts existing in isomeric forms capable of forming intramolecular hydrogen bonding are useful for attaching to and thereby dispersing the carbon nanotubes. Chondroitin sulfate isomers, each having a different secondary structure, have been demonstrated (see Examples section below) to show different nanotube dispersion efficacies due to their different intramolecular interactions arising from different spatial arrangements of the functional groups. These isomers effectively disperse SWNTs into small bundles or individual tubes due to their weaker intramolecular hydrogen bonding and low amounts of alpha-helicity in their conformations (i.e. extended conformations) in solution.

In various embodiments, the chondroitin sulfate cation salt has the formula (I)

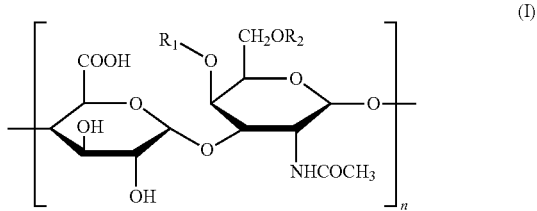

where
$R_1$ is $MSO_3$ and $R_2$ is H, or $R_1$ is H and $R_2$ is $MSO_3$;
M is an alkaline metal, or an alkaline earth metal further bound to a monovalent counter-anion; n is at least 20.

In various embodiments, M may be selected from the group consisting of sodium, potassium and calcium.

In one embodiment, M is sodium. In various embodiments, when M is an alkaline earth metal such as calcium, the monovalent counter-anion may be selected from the group consisting of chloride, bromide, iodide, chlorate, nitrate and nitrite. The divalent M is thus bound to both —$SO_3$ and the monovalent counter-anion.

In various embodiments n is 20-100,000, 20-10,000, 20-1,000, 20-500, 20-200 or 20-100.

In various embodiments, the solution of the chondroitin sulfate is an aqueous solution.

FIG. 1 shows three isomeric forms of a chondroitin sulfate sodium salt. For the discussion hereinafter, the isomer shown in FIG. 1A is denoted by CS-A, the isomer shown in FIG. 1B is denoted by CS-B, and the isomer shown in FIG. 1C is denoted by CS-C.

In one embodiment, the chondroitin sulfate isomer may be CS-A.

In another embodiment, the chondroitin sulfate isomer may be CS-C.

Chondroitin sulfate isomers, each having a different secondary structure, have been demonstrated (see Examples section below) to show different nanotube dispersion efficacies due to their different intramolecular interactions arising from different spatial arrangements of the functional groups. Only CS-A and CS-C isomers effectively disperse SWNTs into small bundles or individual tubes due to their weaker intramolecular hydrogen bonding and low amounts of alpha-helicity in their conformations (i.e. extended conformations) in solution. CS-B isomer disperses SWNTs poorly due to its relatively stronger intramolecular Coulombic interaction and the highest amount of alpha-helicity in its conformation in solution. Free CS-A and CS-C in water (i.e. in the absence of nanotubes) form extended structures with relatively larger radii of gyration ($R_g$) of 1.3 and 1.4 nm, respectively, while CS-B has a tighter ring-like structure with $R_g$ of 1.0 nm. Compared to CS-B, CS-A and CS-C have more extended wrapping around nanotubes so that their hydrophobic backbones can approach the graphene structure of the nanotube sidewall more closely, leading to more energetically favourable interactions with nanotubes and therefore better nanotube dispersion. AFM images show helical wrappings of CS-A and CS-C around the SWNTs. TEM images confirm the helical wrapping of CS-A around SWNT. XPS analysis and successful fabrication of FETs made from CS-A/Co-MoCAT® establishes that CS-A is easily removed from SWNTs by washing with water. For applications in electronic devices such as transistors (FETs) and logic circuits, the sorted semiconducting nanotubes should not be covered with residual dispersing chondroitin sulfate polymers or else the high intertube resistance would make the device performance inferior. For easy removability of the polymers after dispersion, the chondroitin sulfate polymers should not interact too strongly with the nanotubes.

In various embodiments, the carbon nanotubes may be contacted with or agitated with the solution of chondroitin sulfate by sonication. For example, the carbon nanotubes may be agitated with the solution of chondroitin sulfate by cup-horn sonication. In one embodiment, the carbon nanotubes may be agitated with the solution of chondroitin sulfate by cup-horn sonication in a water-ice bath. Bundles of dispersed carbon nanotubes may subsequently be removed from the suspension by centrifugation.

In yet various embodiments, the mixing may be carried out by standard mixing methods known in the art. Any suitable mixing device may be used, wherein the embodiments are not limited to a particular device. In various embodiments, the mixing may be carried out, but is not limited to, by stirring or shaking the mixture.

In various embodiments, the mixing may be carried out for about 1 to about 60 minutes, such as about 1 to about 50 minutes, about 1 to about 40 minutes, about 1 to about 30 minutes, about 1 to about 20 minutes, or about 1 to about 10 minutes. For example, the mixing time may be about 30 minutes. All mentioned time specifications may be the lower or upper limit of a respective time range.

In order that the invention may be readily understood and put into practical effect, particular embodiments will now be described by way of the following non-limiting examples.

EXAMPLES

Materials

Sodium dedocyl sulfate (SDS), sodium dedocylbenzene sulfonic acid (SDBS), polyvinylpyrrolidone (PVP), chondroitin sulfate-A (CS-A), chondroitin sulfate-B (CS-B) and chondroitin sulfate-C (CS-C) were purchased from Sigma-Aldrich (Singapore) at the highest commercially available purity and used without further purification. Highly-purified HiPco SWNTs (super-purified grade, produced by high pressure CO conversion synthesis) were purchased from Carbon Nanotechnologies, Inc. (Houston, Tex., USA). The received SWNTs were heated in air at 350° C. for 1 h and refluxed in HCl (3M) for 10 h. Then purified SWNTs were collected onto filter paper via vacuum filtration and washed with excess de-ionized (DI) water until the washing water dripping from the filter paper was neutral in pH. The solid on the filter paper was freeze-dried (Christ Alpha 1-2 plus Model) to a loose powder which was utilized for all subsequent purposes. CoMoCAT SWNTs (SWeNT SG65 with at least 90% carbon purity) were purchased from SouthWest NanoTechnologies, Inc. CoMoCAT SWNTs were used without further purification.

Preparation of CS/HiPco SWNT and PVP/HiPco SWNT Solutions

To prepare CS/HiPco or PVP/HiPco SWNT solution, a mixture of HiPco SWNTs (2 mg) and CS aqueous solution (CS-A, CS-B or CS-C, respectively) (10 ml, 1%) or PVP aqueous solution was agitated by cup-horn sonication (SONICS, VCX-130) at 100 W for 30 min in a water-ice bath. The suspension was then centrifuged for 1 h (Sartorius, SIGMA@3K30) with 50,000 g relative centrifugal force (RCF) to remove bundles of SWNTs. The homogeneous supernatant was examined spectroscopically with photoluminescence excitation (PLE) and UV-vis-NIR spectroscopy.

Preparation of SDBS/CoMoCAT SWNT Solution

To prepare SDBS/CoMoCAT SWNT ultra-centrifugation solution, a mixture of CoMoCAT SWNTs (2 mg) and SDBS aqueous solution (10 ml, 1%) was agitated by cup-horn sonication (SONICS, VCX-130) at 100 W for 30 min in a water-ice bath. Then the suspension was centrifuged for 1 h at 60,000 g RCF (Hitachi-Koki CS150GXL) to remove bundles of SWNTs. The homogeneous supernatant, denoted "SDBS/CoMoCAT", was studied and applied in field-effect transistor (FET) fabrication.

SWNT Characterization

Circular Dichroism (CD) of CS-A, CS-B and CS-C

Circular dichroism (CD) of CS-A, CS-B, and CS-C was measured on a Chirascan (Applied Photophysics Limited, UK) in a 0.1 mm pathlength fused quartz cell. The scanning wavelength range was from 180 to 260 nm at 0.5 nm intervals. The scanning speed was 50 nm min$^{-1}$. The concentration of polymer in D$_2$O was 1.0 mg ml$^{-1}$.

Photoluminescence Spectroscopy (PLE)

Measurements were conducted with a Jobin-Yvon Nanolog-3 spectrofluorometer equipped with an IGA (InGaAs) near-infrared (NIR) detector. The chiralities were determined by fitting the energy bandgaps from SWNT's $E_{11}$ emission when the excitation energy matches the nanotube $E_{22}$ energy level. For calculating the semiconducting (n, m) relative abundance distribution, the amplitude of the partial derivative of PLE intensity versus excitation wavelength was computed following the method proposed by Arnold et al., (*Nat. Nanotechnol.* 2006, 1, 60).

Ultraviolet-Visible-Near-Infrared (UV-Vis-NIR)

Absorption spectroscopy was performed with a Varian Cary 5000 UV-vis-NIR spectrophotometer. A 10 mm pathlength quartz cuvette was used for characterization.

Atomic Force Microscopy (AFM)

AFM was performed using a MFP 3D microscope (Asylum Research, Santa Barbara, Calif.) in AC (tapping) mode. For AFM measurement of polymer-SWNTs solutions, the polymer-SWNTs supernatant solution was deposited onto a silicon wafer (the silicon wafer was pre-cleaned by exposure in Ar plasma (PX-500™, March Plasma Systems, Concord, Calif.) for 1 min with 100 W discharge power at 350 sccm Ar flow rate) and then rinsed for one day using neutral DI water.

Transmission Electron Microscopy (TEM)

TEM was conducted using a JEOL JEM-2010 high-resolution transmission electron microscope (HR-TEM) at 200 kV. To prepare samples for the TEM, 10 μl of supernatant solution of polymer-SWNTs after ultra-centrifugation was dropped onto a 400 mesh Lacey Formvar/Carbon-grid (PELCO, CA). Grids were dried at room temperature and then dipped into neutral DI water with shaking for 10 h to rinse away the polymer.

Computer Simulations to Study Binding of CS-A, CS-B and CS-C with (7,6) SWNTs (7,6) SWNTs with length of 10 nm was used in the simulation.

Aromatic carbon type without partial charge was assigned to carbon atoms of the SWNTs. Force fields of the three isomers of CS were generated with antechamber program; partial charge was generated with R.E.D. III by performing quantum chemistry (QM) calculation with widely used commercial computer software package "Gaussian with HF (Hartree-Fock)/6-31 G* basis" for quantum chemistry computations, and fitted by RESP (Restrained electrostatic potential) method. The SWNT was aligned along the x-direction and a fully extended CS molecule (7-monomer length) was placed beside the SWNT. The SWNT-CS complex was placed in the centre of a 12 nm×6 nm×6 nm box with ~13000 TIP3P water molecules. Fourteen sodium ions were added to neutralize the system because each CS monomer has 2 negative charges. All simulations were run by employing the GROMACS package (David van der et al., *J. Comp. Chem.* 2005, 26, 1701). The Amb2 gmx conversion utility tool (Mobley et al., *J. Chem. Phys.* 2006, 125) was used to convert Ambe-type format to gromacs-type format. All bonds involving hydrogen atoms were constrained in length according to LINCS protocol (Berk et al., *J. Comp. Chem.* 1997, 18, 1463). The position of the SWNT was restrained at the centre of the water box by applying a harmonic force on the SWNT. This allowed the use of an integration step of 0.002 ps in the simulations. Non-bonded pair lists were re-calculated every 5 integration steps or 0.01 ps period. The protein and the water were separately coupled to respective external heat baths at 300K with a relaxation time of 0.1 ps. Outputs of the structure snapshots or trajectories were provided every 1 ps for analysis. Electrostatic interactions were treated with particle mesh Ewald method (Darden et al., *J. Chem. Phys.* 1993, 98, 10089) with a cutoff of 9 Å, and a cutoff of 12 Å was used in the calculations of van der Waals interactions. Two independent simulations were carried out for each CS-SWNT pair and run for 20 ns. Binding free energy estimates were performed using the generalized Born (GB) implicit solvent model developed by Alexey et al. (*Proteins: Struct. Funct. Bioinform.* 2004, 55, 383) provided by the sander module in AMBER 9 (Case et al., University of California, San Francisco, 2006).

Back-Gated SWNT FETs

Back-gated SWNT FETs were made by drop-casting CS-A/SWNT solution on p-type silicon wafers capped with thermally grown silicon dioxide layers (300 nm). The source and drain electrodes were made of Au (60 nm) coated on top of Ti (10 nm thick). The channel width was 50 μm and the length 50 μm. The SWNT solution was dropped onto the devices, which were then dried and rinsed with DI water. The process was repeated until the devices formed a percolation path. The device property measurements were recorded with a Keithley semiconductor parameter analyzer Model 4200-SCS. The drain voltage was −2V and the p-type silicon was the back gate.

Results and Discussion

Comparison of HMO SWNT Dispersion with the Three CS

Figure 2:
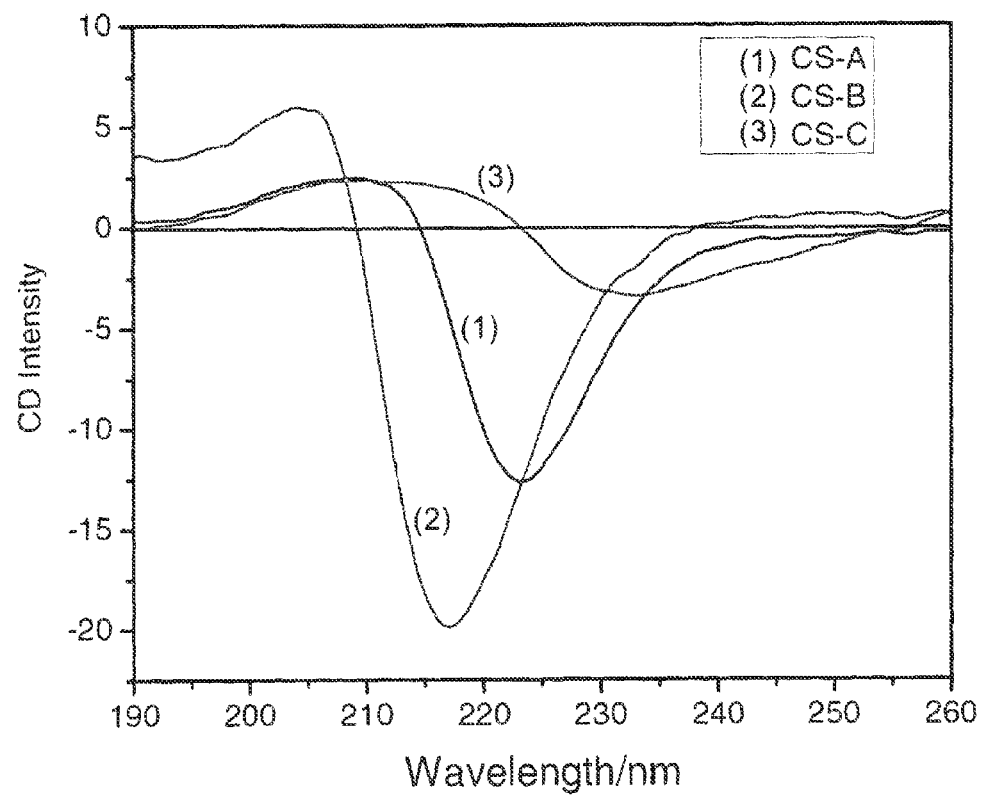
FIG. 2 shows the CD spectra of the three isomers CS-A, CS-B, and CS-C.

The secondary structures of neat CS-A, CS-B, and CS-C polymers in solution were determined by circular dichroism (CD) spectroscopy (FIG. 2). The CD spectra obtained indicates that the three isomers have varying degrees of alpha-helix structure. The evidence of alpha-helicity in the structures of CS-A and CS-B are indicated by the negative peaks at 222 and 218 nm, respectively, in the CD spectra. The higher absorbance at 218 nm (CS-B) than at 222 nm (CS-A) suggests a higher content of alpha-helicity in CS-B (27.4%) than in CS-A (24.2%), which agrees well with the CD deconvolution data (FIG. 3). The spectrum for CS-C, on the other hand, suggests less alphahelix structure (16.6%) in this isomer.

Figure 4:
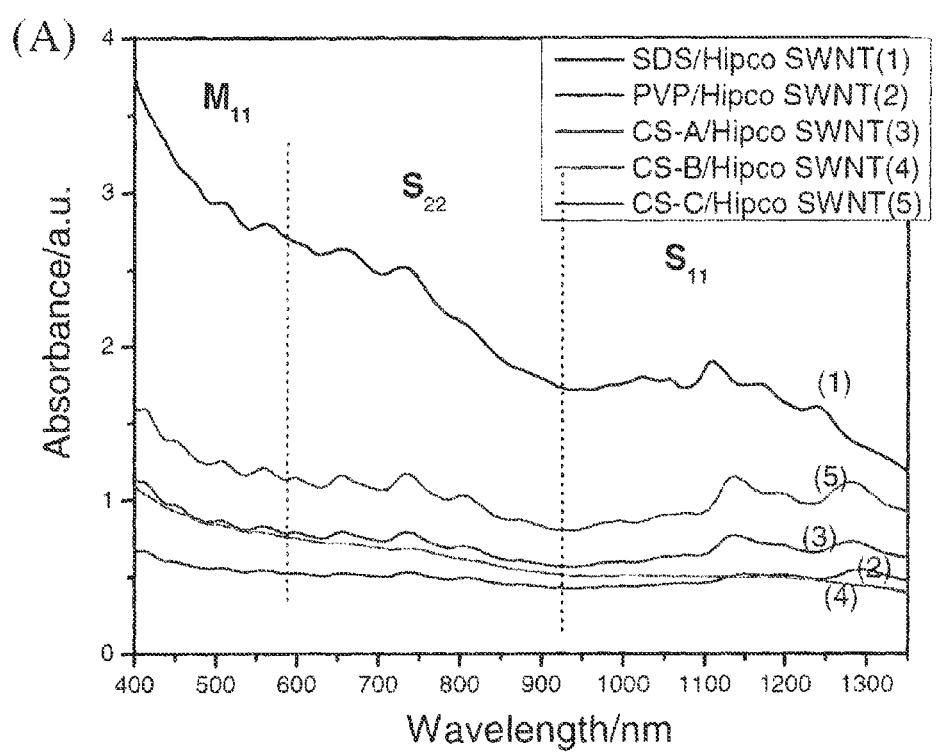
FIG. 4 shows (A) UV-vis-NIR results, (B) A(S)/A(T) ratio, and (C) absorbance at 500 nm of the three isomers CS-A, CS-B, and CS-C. The straight line of each graph is a linear-least-squares fitted to the data.
Figure 4:
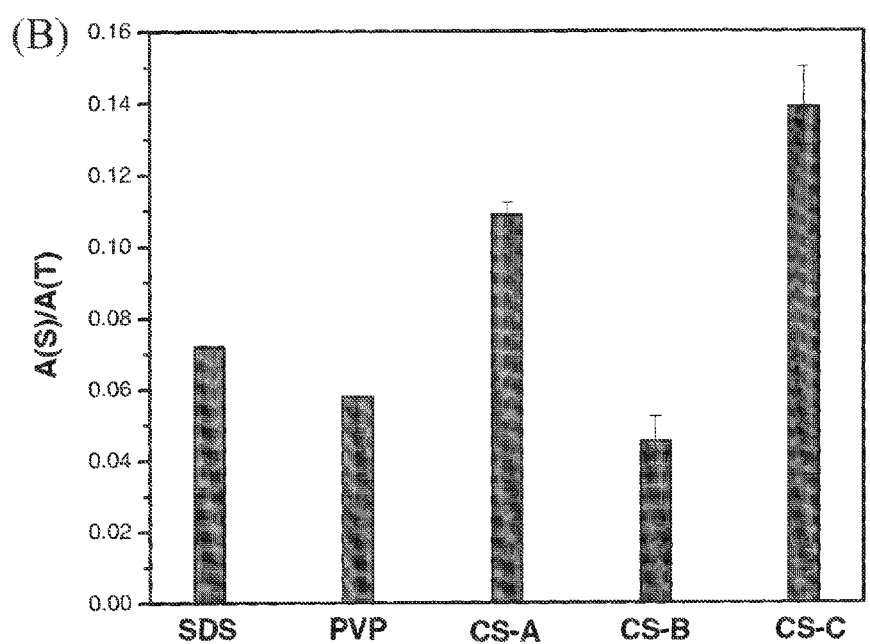
Figure 4:
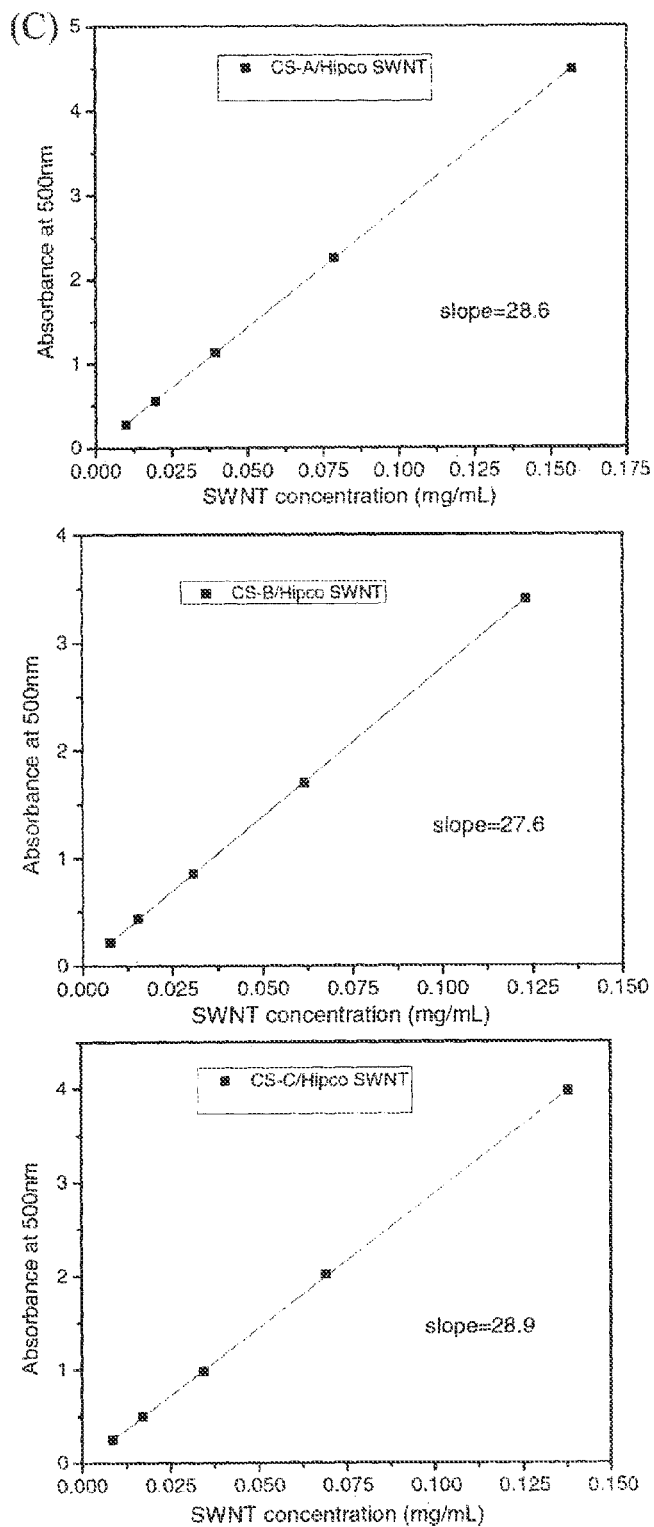

The three HiPco SWNTs solutions employing CS-A, CS-B and CS-C as dispersants were characterized by UV-vis-NIR and the results are shown in FIG. 4A. Higher absorbance generally correlates to higher solubility of SWNTs in the solution and as shown in FIG. 4A CS-C thus appears to have the highest absorbance while CS-B the lowest absorbance among the three isomers.

A(S)/A(T) values for these three solutions were determined (Itkis et al., *J. Am. Chem. Soc.* 2005, 127, 3439): A(S) is the area of the $E_{22}$ interband transition due to the nanotubes after baseline subtraction and A(T) is the total area under the spectral curve due to various carbonaceous materials such as SWNTs, multiwalled nanotubes, and carbon. The A(S)/A(T) ratio is an index of the ability to selectively suspend/disperse SWNTs rather than other forms of carbon in the samples. From FIG. 4B, it is seen that amongst the three forms of CS dispersants, CS-C selectively disperses SWNTs most effectively as it has the highest A(S)/A(T) ratio of around 0.139±0.011. CS-A, with an A(S)/A(T) ratio around 0.109±0.004, selectively disperses SWNTs relatively well (better than SDS) but it is not as effective as CS-C. CS-B cannot disperse SWNTs as witnessed by the low A(S)/A(T) ratio of 0.045±0.007 and near absence of peaks in the UV-vis-NIR spectrum of the CS-B/HiPco SWNT sample. These results show that the three isomers, though having the same chemical formulae but different spatial arrangements, have different abilities to disperse SWNTs. CS-A and CS-C have higher A(S)/A(T) ratio than PVP (with an A(S)/A(T) value of 0.058) as dispersant of HiPco SWNTs in aqueous solution.

Figure 5:
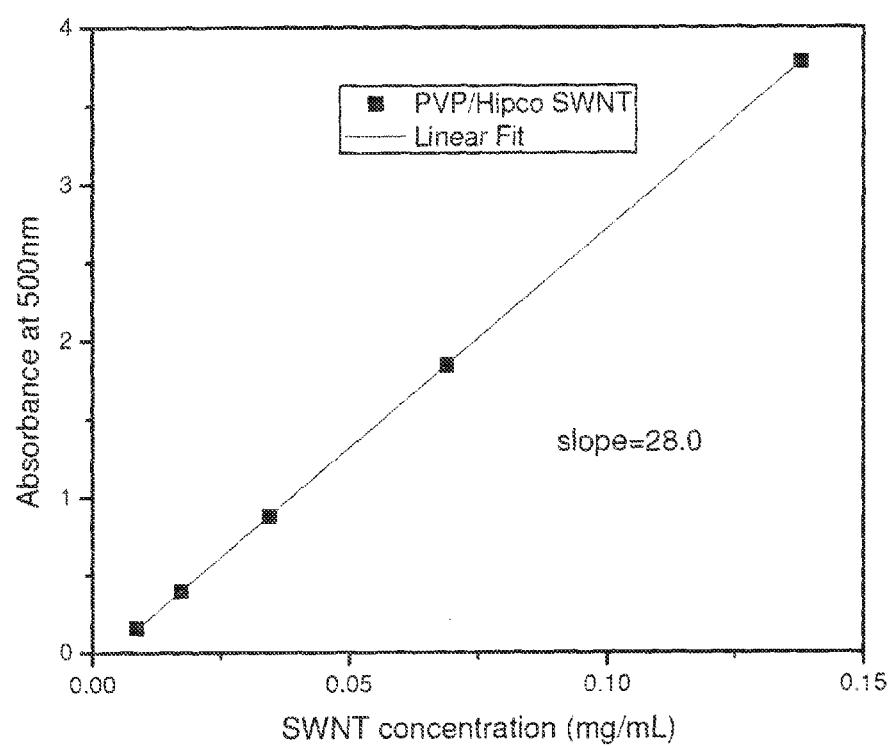
FIG. 5 shows (A) UV-vis-NIR result of PVP as dispersant of HiPco SWNTs in aqueous solution, (B) absorbance at 500 nm, as comparative example. The straight line of each graph is a linear-least-squares fitted to the data.

Another way to quantify the nanotube concentration in the supernatant after centrifugation is with Beer's law, $A=\epsilon bc$, where A is the optical density at 500 nm, E is the extinction coefficient, and b is the pathlength (b is 1 cm for the present cell), and c is the concentration. The respective ε of HiPco SWNTs solutions with CS-A, CS-B, and CS-C as dispersants was determined from the slope of the absorbance versus SWNT concentration at very dilute concentrations (fitted using linear-least-squares analysis) to be 28.6, 27.6, and 28.9 ml mg$^{-1}$ cm$^{-1}$, respectively (FIG. 4C). The concentrations of SWNTs in CS-A/(HiPco SWNT), CS-B/(HiPco SWNT), and CS-C/(HiPco SWNT) after 50,000 g centrifugation were 0.029, 0.027, and 0.041 mg ml$^{-1}$, respectively, which were much higher than the respective values for SDS (0.019 mg ml$^{-1}$ at 120,000 g necessary for debundling) (Yan et al., *J. Phys. Chem. C* 2008, 112, 7579) and PVP (0.020 mg ml$^{-1}$) (FIG. 5).

The yields of dispersed SWNTs in the supernatant using CS-A, CS-B, and CS-C were 14.5%, 13.5%, and 20.5%, respectively, which are comparable to or higher than those of SDS and PVP (9.9% and 10.0% respectively).

Figure 6:
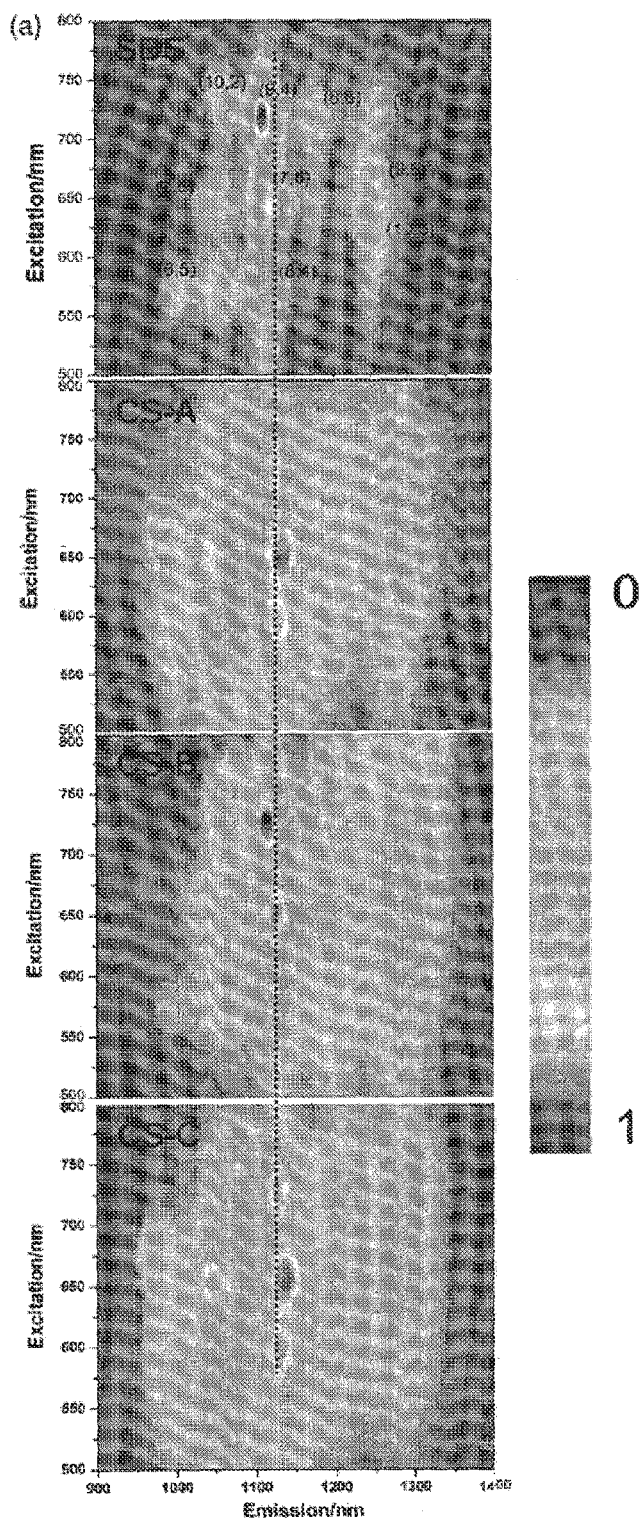
FIG. 6 shows (a) photoluminescence results; (b) relative abundance graphene maps for SDS/(HiPco SWNT), CS-A/(HiPco SWNT), CS-B/(HiPco SWNT), and CS-C/(HiPco SWNT); (c) plots of relative abundance of each chirality of SDS/HiPco, CS-A/HiPco, CS-B/HiPco and CS-C/HiPco; (d) emission peaks of different HiPco solutions. Emission peaks red-shifted from CS-B/HiPco SWNT solution for CS-A/HiPco and CS-C/HiPco SWNT solution.
Figure 6:
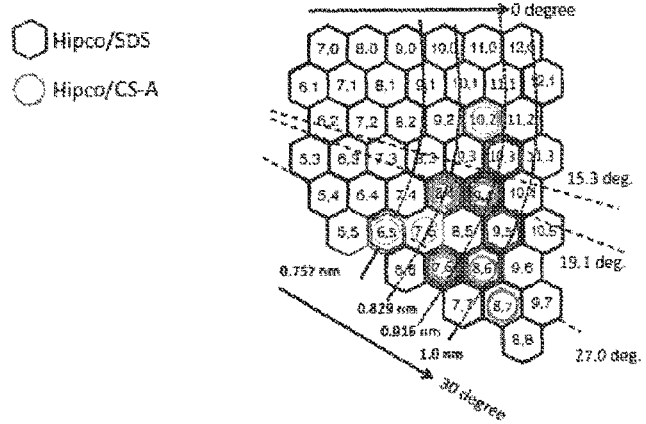
Figure 6:
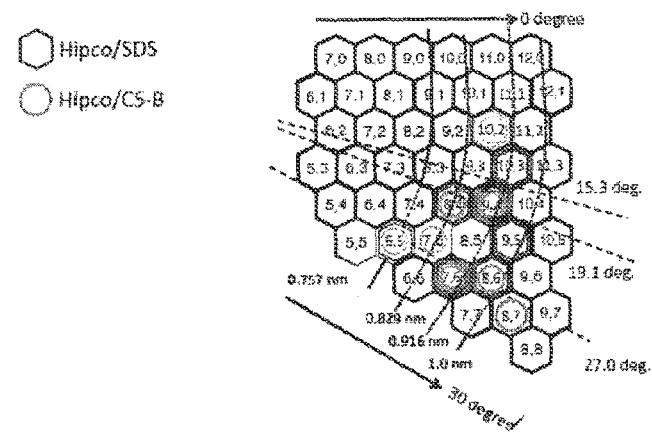
Figure 6:
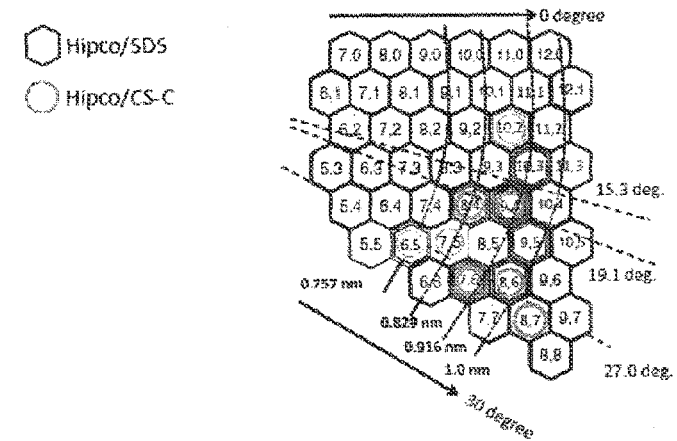
Figure 6:
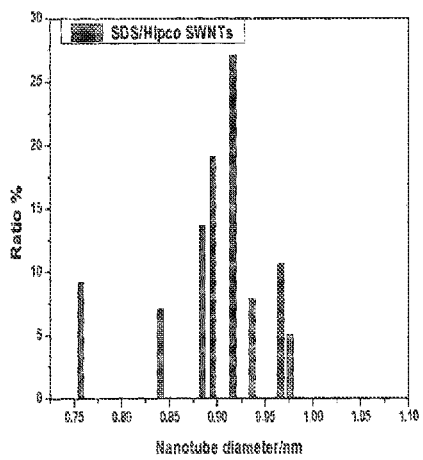
Figure 6:
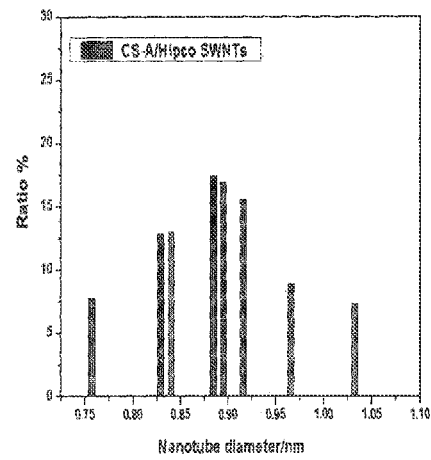
Figure 6:
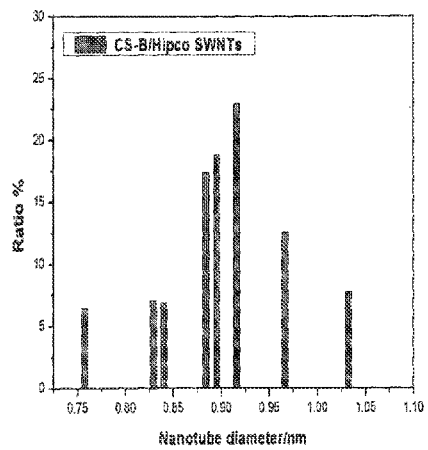
Figure 6:
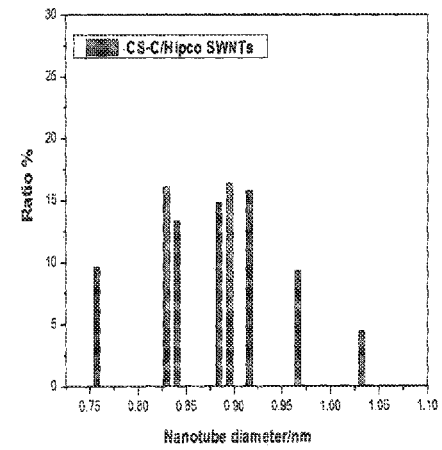
Figure 6:
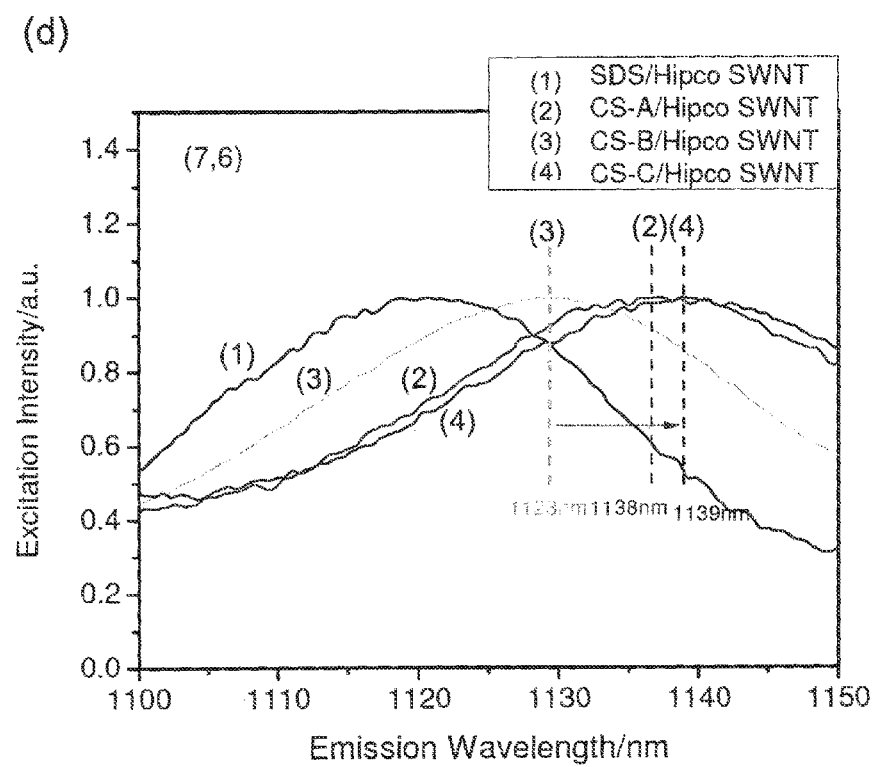

PLE spectroscopy was also used to characterize the semiconducting species of CS/HiPco SWNTs supernatant solutions (FIG. 6A). The species distributions with the three isomers are shown in the graphene map (FIG. 6B). It appears that the semiconducting nanotubes selected by the three isomers, like the SDS sample, have no particular chiral angle or diameter range (FIG. 16). However, the emission wavelengths of the peaks of CS-A and CS-C have undergone a red shift compared to the peaks of CS-B and SDS, as indicated by the rightward offset of the (7,6) peaks of about 10 and 11 nm, respectively, of CS-A and CS-C with respect to the vertical line passing through the same peak of the CS-B sample (FIG. 6A and FIG. 6C). The observed red shift may be attributed to better access of water to tube surface due to a better wrapping pattern. The conformation of CS-A and CS-C might fit the surface curvatures of SWNTs better and hence disperse SWNTs better than CS-B.

Figure 7:
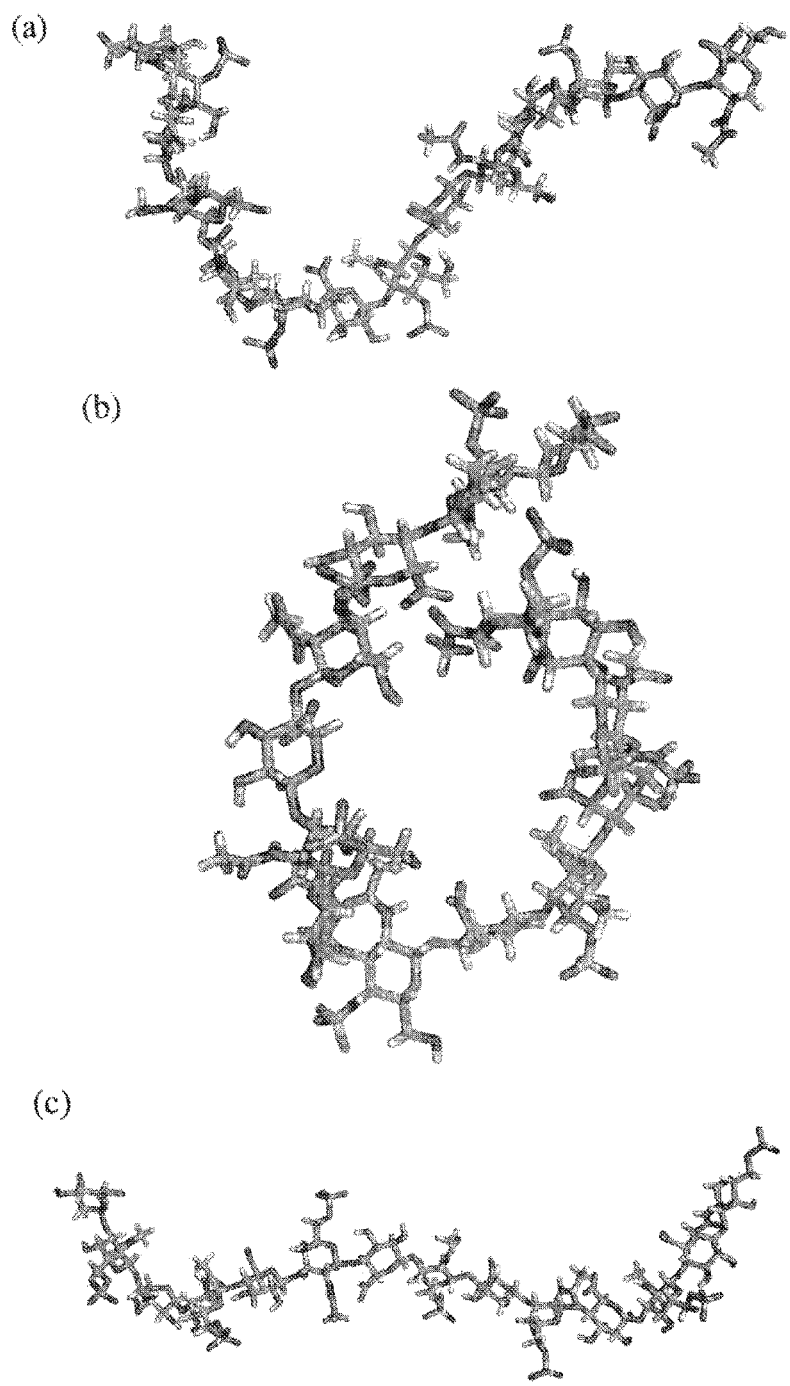
FIG. 7 shows computer simulated conformations of the heptamer isomers: (a) CS-A, (b) CS-B, and (c) CS-C, in water.
Figure 8:
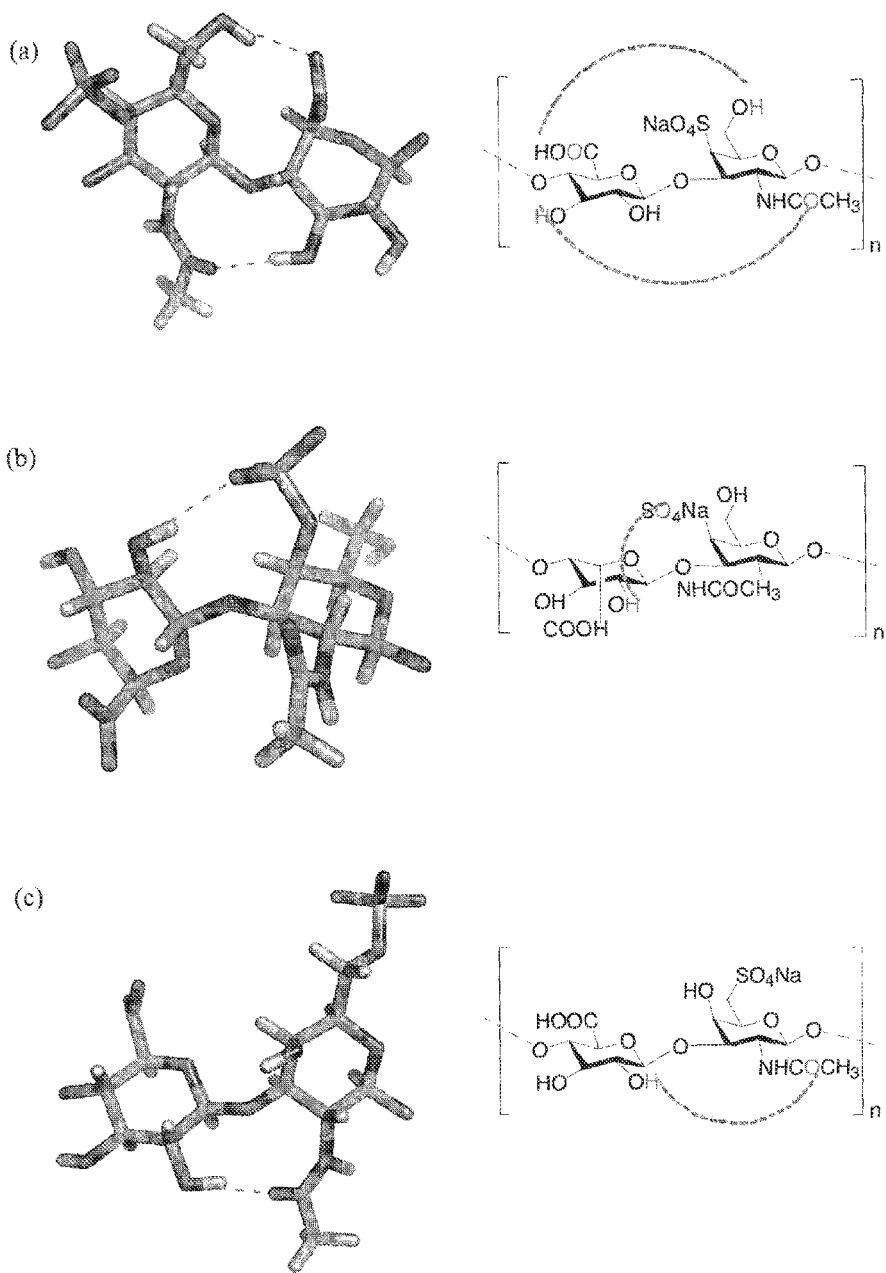
FIG. 8 shows intramolecular interactions of (a) CS-A, (b) CS-B, and (c) CS-C monomers (Left: computer model; Right: the illustrations). The dotted lines show the interaction in the monomer.

To explain the different SWNT dispersion efficacies of the three CS isomers, computer simulations were carried out with heptamer CS molecules. Structure clustering with the three CS isomer molecules (without SWNTs) in water was done. The standard structures of the largest cluster obtained are shown in FIG. 7. The three isomers of the CS oligomers, each with 7 repeating units, adopt different conformations when they wrap around the nanotubes. CS-A and CS-C have a more extended geometry while CS-B aggregates into a ring structure. The minimum values of radii of gyration ($R_g$) in a 20 ns trajectory for the three CS molecules (without SWNT) are 1.3 nm (CS-A), 1.0 nm (CS-B) and 1.4 nm (CS-C). The smaller value of $R_g$ for CS-B indicates that it is more flexible and can be easily compacted into a random coil in water. The different conformations can be explained by the different intramolecular interactions (specifically Coulombic interactions and hydrogen bonding) in the three isomeric forms of CS (FIG. 8). In FIGS. 8A-8C, monomer CS repeating units are depicted for simplicity in the illustration of the significant intramolecular interactions computed. Weaker intramolecular hydrogen bonding was found to exist in CS-A and CS-C while stronger Coulombic interactions (between the —SO3⁻ and —OH) is present in CS-B. The stronger intramolecular interaction in CS-B results in a more compacted form and smaller $R_g$ in solution.

Figure 9:
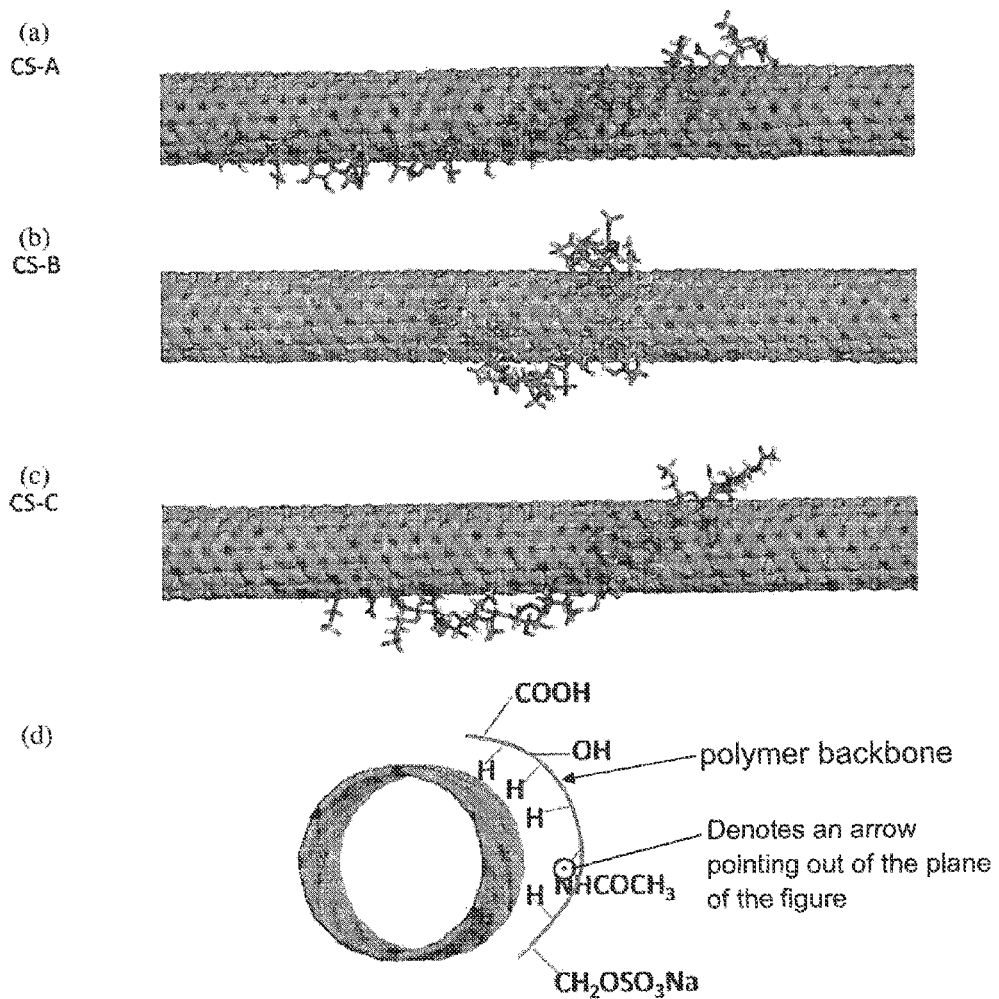
FIG. 9 shows computer simulation structure models of CS-SWNT (7,6) complex, specifically (7,6) SWNT with (a) CS-A, (b) CS-B, and (c) CS-C wrapping around the SWNT, (d) schematic of CS wrapping around a nanotube.

The conformations of the three CS oligomer isomers, each with 7 repeating units, in the presence of nanotube were also computed. FIG. 9A-C show that the three heptamer CS molecules tightly adsorbed around the SWNTs but adopt different conformations. CS-B wraps around the SWNT in a tighter helical manner, while the wrap patterns of CS-A and CS-C around the nanotubes are relatively more extended. For sufficiently long chains, CS-A and CS-C form helical wrappings around the SWNTs. CS-B, on the other hand, does not extend out on the nanotube surface. Considering the smallest $R_g$ and strong intramolecular interaction for isolated CS-B, it appears that the flexible CS-B easily aggregates with itself rather than interacts with nanotubes, so that the ring pattern hinders CS-B from wrapping around carbon nanotubes (CNTs). For CS-A and CS-C, the extended geometries help them to adsorb onto and helically wrap CNTs.

During the 20 ns simulations, no dissociation events between the CS molecule and SWNT occurred. The more extended conformations of CS-A and CS-C in water allow their hydrophobic main chain to approach and form stable adsorptions on SWNTs more readily than CS-B. In the models of CS-A, CS-B and CS-C wrapping around the (7,6) nanotube, it is observed that —COOH and —OH groups extend out into the solution and that —NHCOCH$_3$ group align almost parallel to the nanotube axis, while H atoms of the backbone are inside the helical structures and interact with the nanotube sidewalls (FIG. 9D). For all the CS isomers, the hydrophobic surface is in contact with the nanotube, leaving hydrophilic groups (such as —SO$_3$, and —COO) outside of the coil. The height of polymer on the CNT is estimated to be around 0.8 nm for CS-A and CS-C through the radial distribution function of CS-A (or CS-C) with respect to the surface of CNT.

Figure 11:
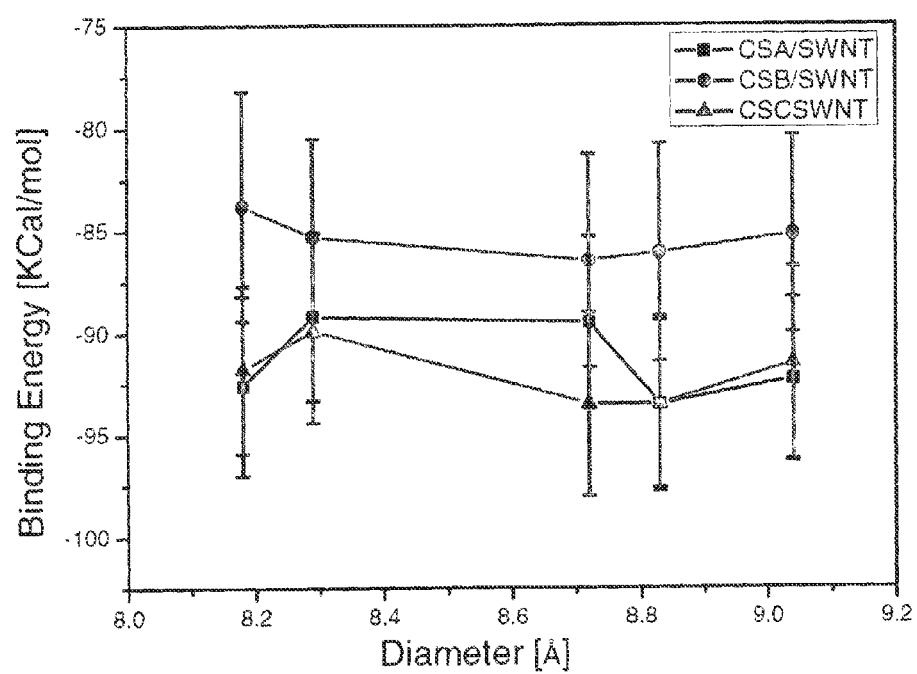
FIG. 11 shows the binding energy between polymer and SWNTs with different tube diameters.
Figure 12:
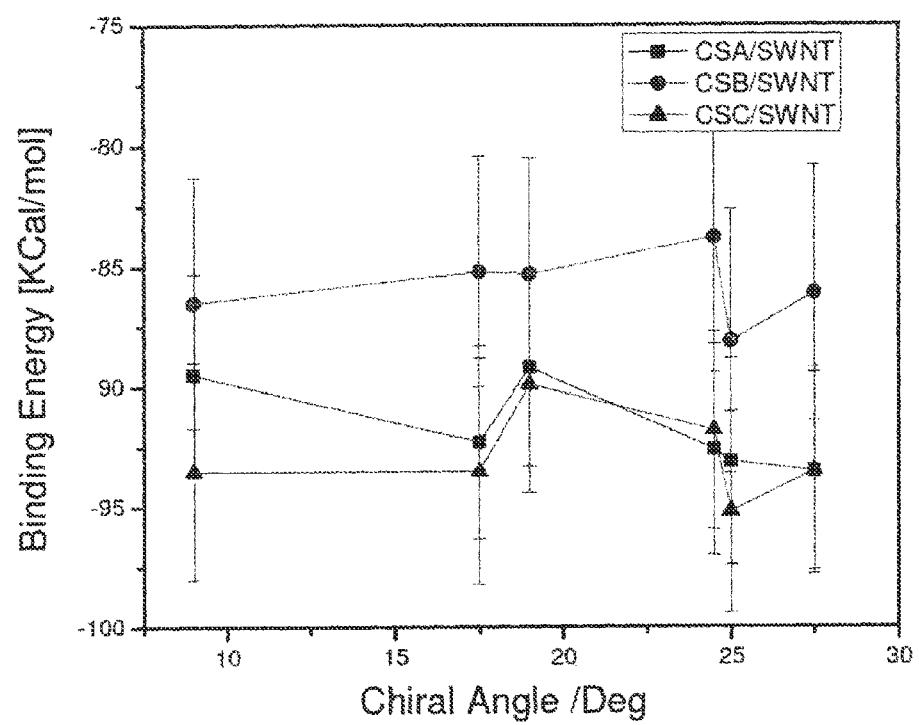
FIG. 12 shows the binding energy between polymer and SWNTs with different tube chiral angle.

Estimations of the respective SWNT-CS binding energies were done to investigate the differential interactions of the CS isomers with the SWNTs. The binding energy of a SWNT-CS complex was calculated as follows:

$$E_B = E_C^{GB} - (E_P^{GB} + E_T^{GB})$$

where $E_C^{GB}$, $E_P^{GB}$, and $E_T^{GB}$ are the energies of SWNT-CS complex, CS polymer and nanotube, respectively, based on the implicit GB model. The binding energies of the five main SWNT species in HiPco samples (i.e., (7,5), (8,4), (10,2), (7,6), and (9,4) with diameters from 0.829 to 0.966 nm) were calculated. The binding energies listed in FIG. 10A and FIG. 11 indicate that the binding of CS-B with each chiral SWNT is much weaker than CS-A or CS-C. There is not much difference between the binding energies of CS-A and CS-C with SWNTs. Considering the simplicity of the computational model employed here, e.g. no partial charges on the SWNTs, the resolved differential binding of different CS isomers on the SWNTs may be primarily due to their different conformations around the SWNTs. The binding energy between polymer and SWNT appears to be related to the SWNT's diameter for the better dispersing CS-A and CS-C (FIG. 11). Species (7,5) and (8,6) have similar chiral angle, but the binding energy of polymer/(8,6) SWNT with larger nanotube diameter (0.966 nm) is higher than that of polymer/(7,5) SWNT with smaller nanotube diameter (0.829 nm). Our data also suggest no correlation of binding energy with chiral angle within the values studied (FIG. 12).

Figure 13:
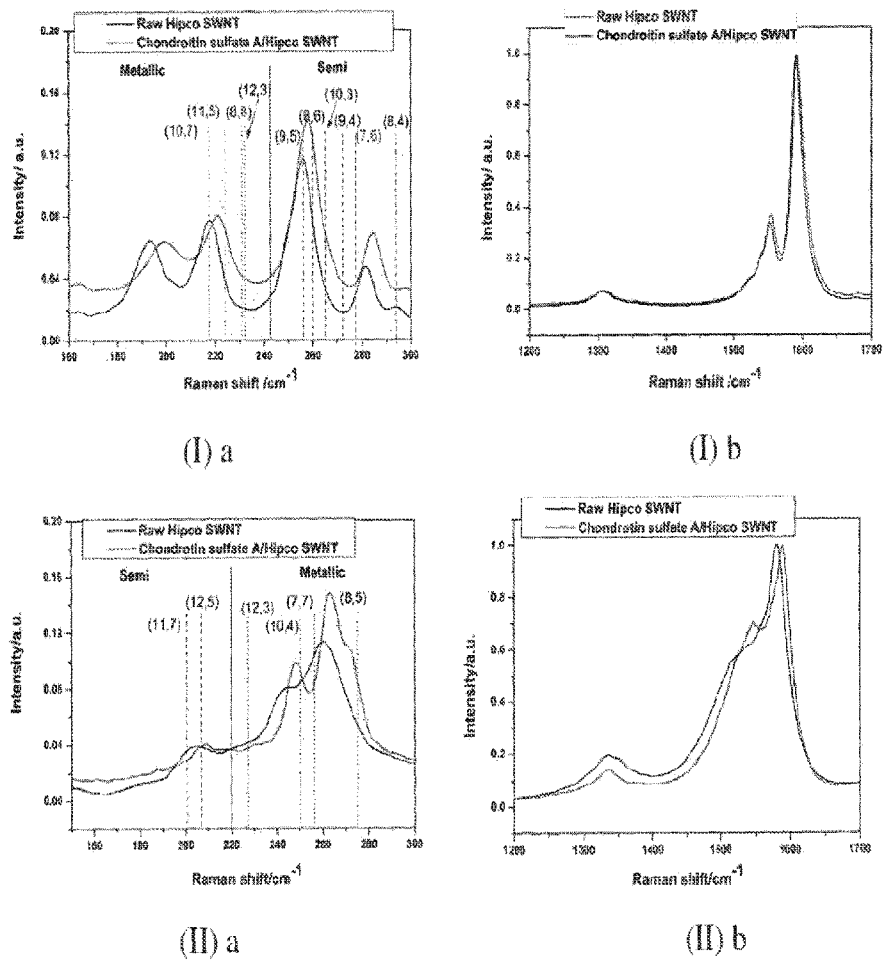
FIG. 13 shows Raman spectra of acid purified HiPco SWNT and CS-A/HiPco SWNT complex with (I) 633 nm source laser and (II) 514 nm source laser.

The removability of CS-A and CS-C from HiPco nanotubes with washing was examined by XPS and compared with SDS. SDS/HiPco and CS/HiPco solutions were filtered onto filter paper and washed with excess water. The nanotubes on the filter papers were then characterized with XPS (FIG. 10B). SDS data showed that some residual sulfur (S) remains although this surfactant can be removed by washing with water. In the CS-A/HiPco and CS-C/HiPco samples, there are also very low S contents, illustrating that most of the CS isomers have been washed away. Typically, polymeric dispersants cannot be removed easily but CS appears to be more readily removable than other polymers that interact with nanotubes via π-π stacking. By comparison with polymers having π-π interactions with nanotubes, the interaction of CS-A and of CS-C with nanotubes is likely not to be so strong as to prevent its removal. Also, CS wraps around nanotube without alteration of the nanotube's intrinsic structure (FIG. 13, Raman results). The removal of dispersant/surfactant from nanotubes after dispersion is critical for applications in electronic devices, for example.

The TEM image (FIG. 14A1) shows that using CS-A, the nanotubes are well-dispersed into individual tubes. The AFM image (FIG. 14A2) corroborates the observation that CS-A can disperse SWNTs into individual nanotubes with less than 1 nm diameter. Most of the polymer chains have been washed away since water had been passed over the samples for 10 min. For CS-B/(HiPco SWNT) solution, the TEM image (FIG. 14B1) shows bundles of SWNTs. The height profiles of the corresponding AFM pictures (FIGS. 14B2,B3) indicate that the SWNTs exist as bundles with diameter of ~10 nm, which indicates poor dispersion by CS-B. For CS-C/(HiPco SWNT), the TEM image (FIG. 14C1) shows individually dispersed SWNTs, though there is polymer wrapped around them. The height profile of the corresponding AFM picture (FIG. 14C2) shows that the nanotubes exist as individual tubes (with height of around 1 nm), co-mingled with small bundles (few nm in diameter) together with some polymer (seen as white speckles) left even under the same washing condition as for CS-A HiPco samples.

Figure 14:
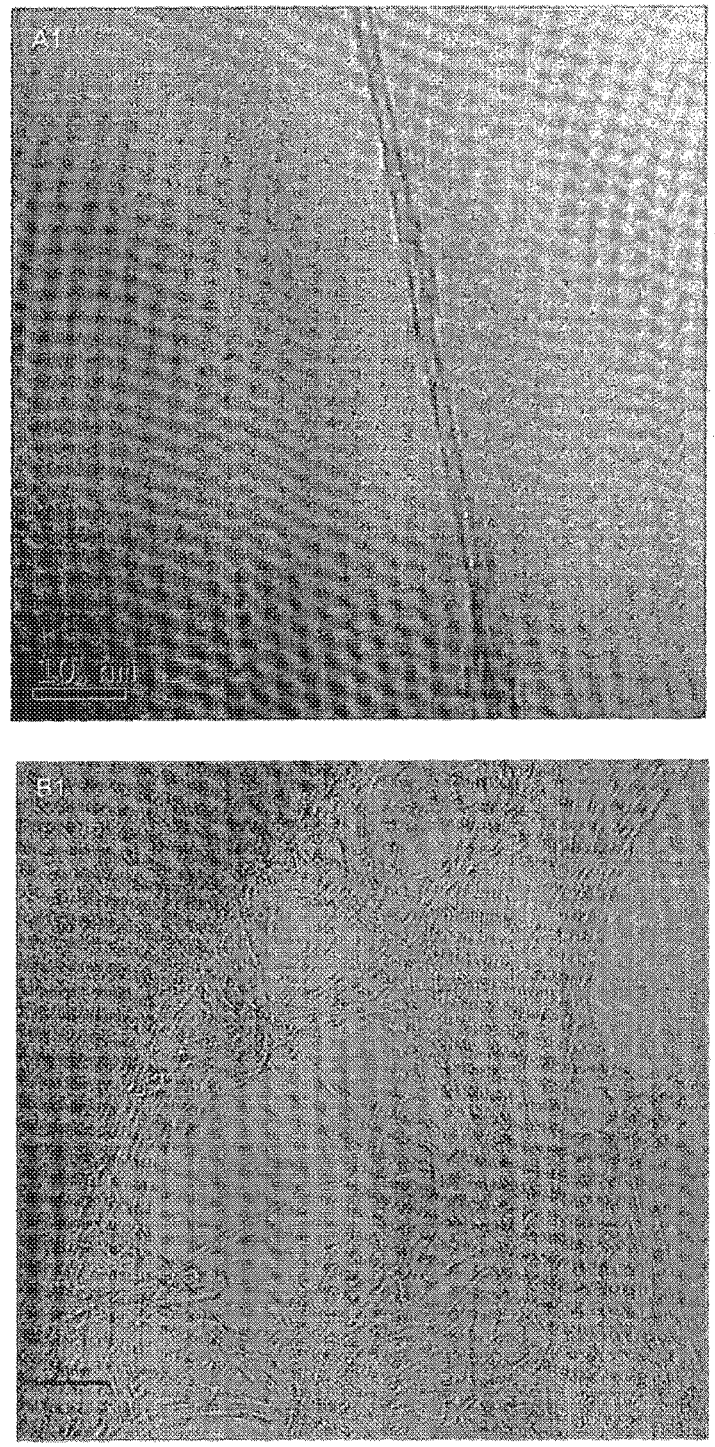
FIG. 14 shows (A1) TEM image of washed CS-A/(HiPco SWNT) on the carbon layer of a TEM grid; (A2) AFM image of washed CS-A/(HiPco SWNT) on Si; (B1) TEM image of washed CS-B/(HiPco SWNT) on the carbon layer of a TEM grid; (B2) AFM image of washed CS-B/(HiPco SWNT) on Si; (C1) TEM image of washed CS-C/(HiPco SWNT) on the carbon layer of a TEM grid; (C2) AFM image of washed CS-C/(HiPco SWNT) on Si; (A3, B3, C3) Enlarged AFM view of washed CS-A/HiPco, CS-B/HiPco, and CS-C/(HiPco SWNT), and height profiles along the line showing the polymer helical wrapping of the SWNT.
Figure 14:
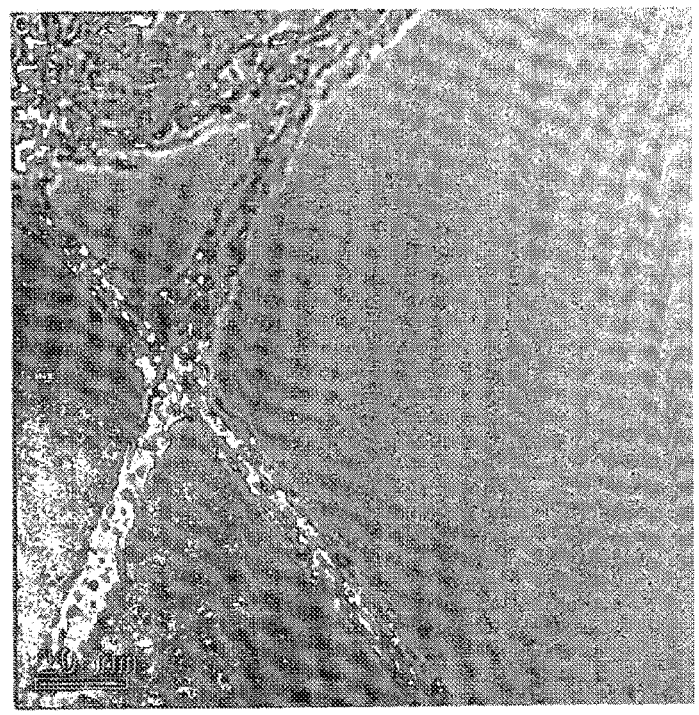
Figure 14:
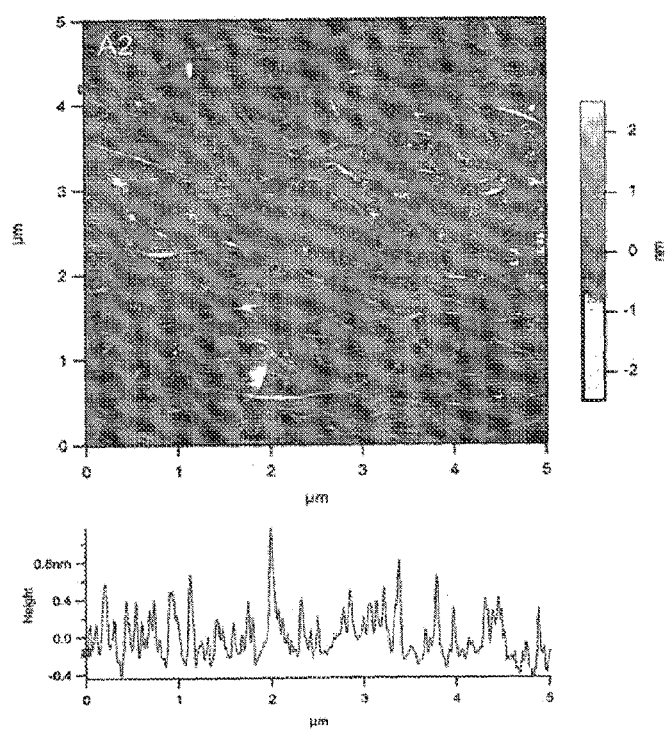
Figure 14:
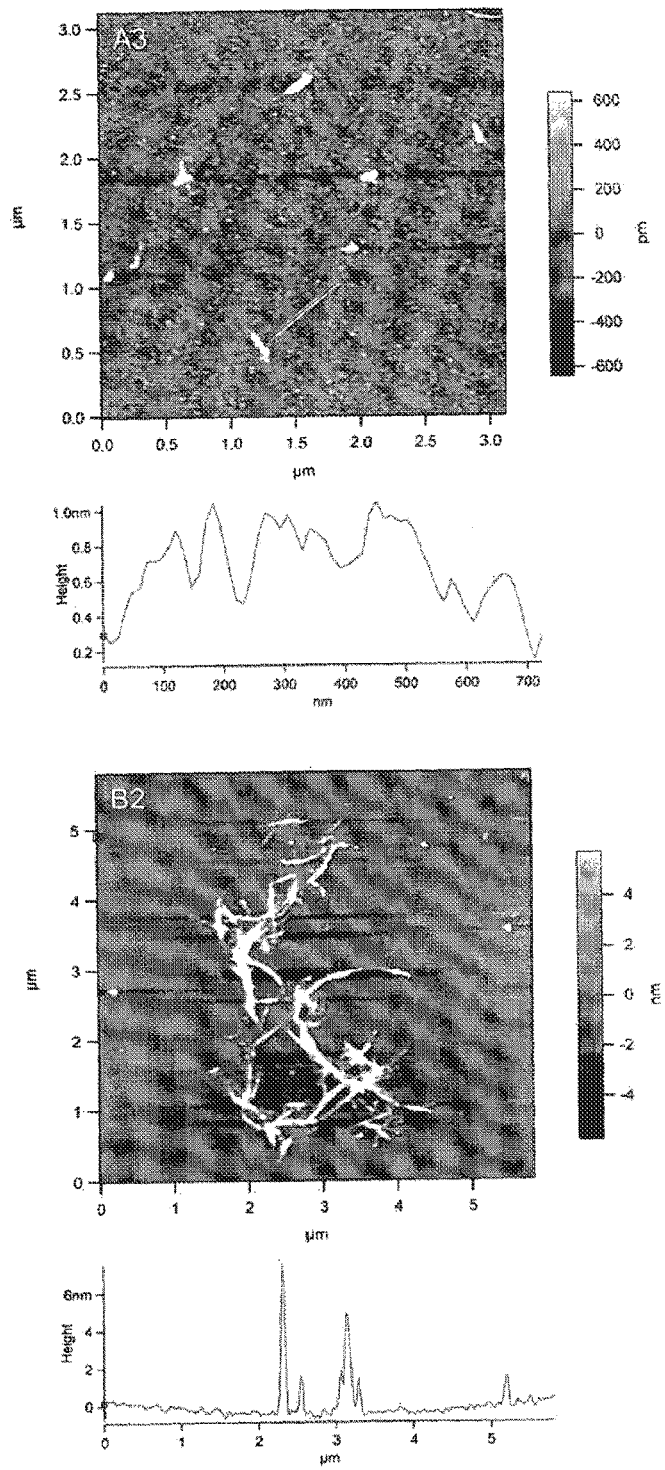
Figure 14:
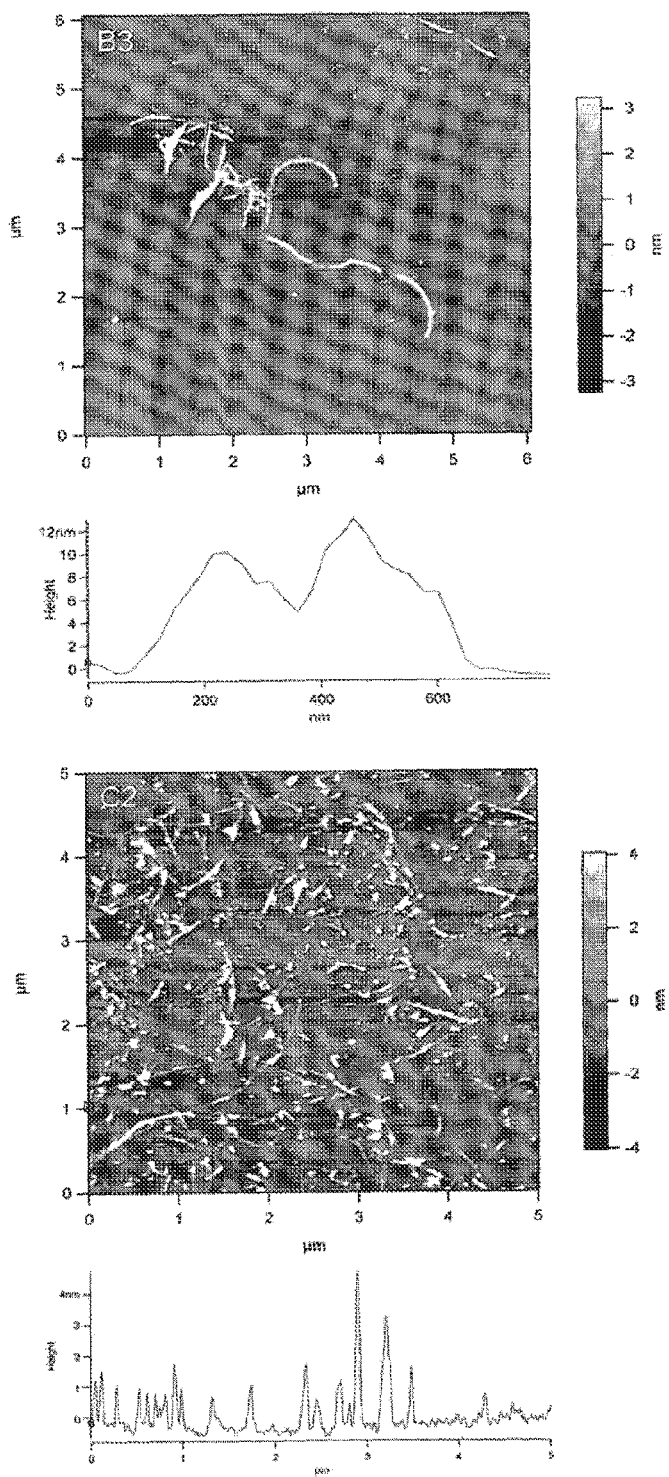
Figure 14:
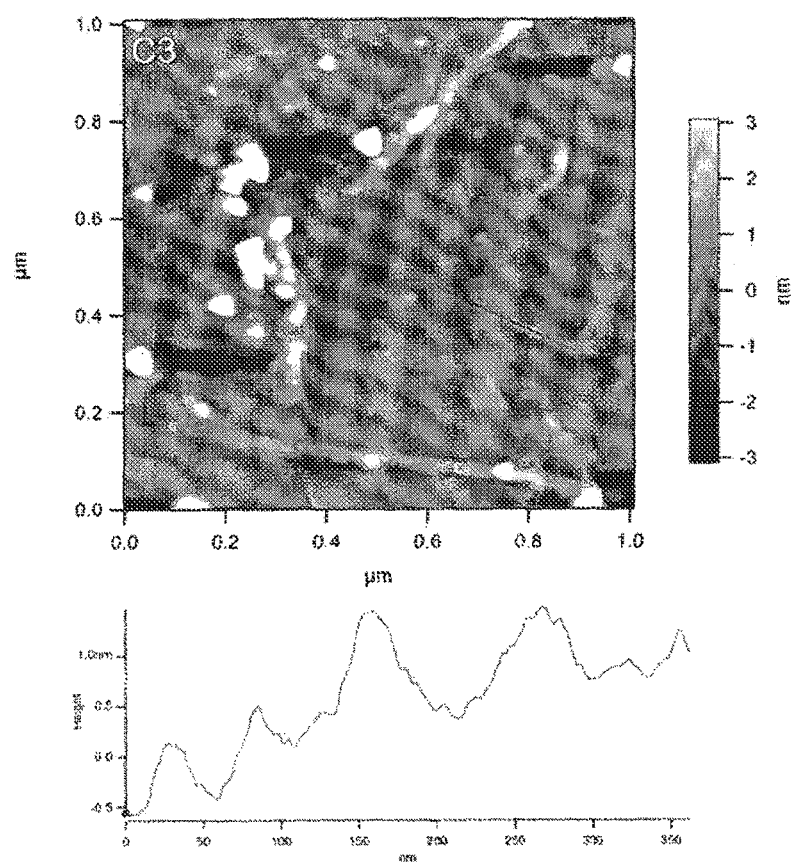

Further, higher magnification AFM images (FIGS. 14A3, C3) show periodic wavelike height profiles for two of the CS, viz. CS-A and CS-C. The AFM image of FIG. 14A3 shows helical wrapping of CS-A of ~0.7 nm thick around the SWNTs, which corroborates the CS-A wrapping seen in the TEM image (FIG. 14A1). Periodic wavelike profiles with height of ~0.7 nm in the AFM image (FIG. 14C3) also indicate helical wrapping of CS-C around the SWNT. The poor solubility of CS-C results in the polymer not being easily washed away as shown by the thick residual polymer left on the nanotubes seen in the TEM and AFM pictures (FIGS. 14C1,C3). From the periodic wavelike height profiles of CS-A and CS-C (FIGS. 14A3,C3), the height of the polymers on the nanotubes is found to be about ~0.5-1.0 nm, which is corroborated by the calculated thickness of 0.8 nm by the simulation described above.

To prove the easy removability of CS-A, network field-effect transistor (FET) devices using CS-A/CoMoCAT® SWNT solution were fabricated. As-synthesized HiPco SWNTs cannot be used to fabricate devices that are switchable as they have a wide chirality distribution with too many metallic nanotubes. CoMoCAT® SWNTs have few chiralities, higher semiconducting nanotube content as supplied, and shorter tube length, so that some devices can be switched on and off even without metallicity-based separation. If a thick layer of residual polymer remains, the current through the SWNT network will be negligible.

Figure 15:
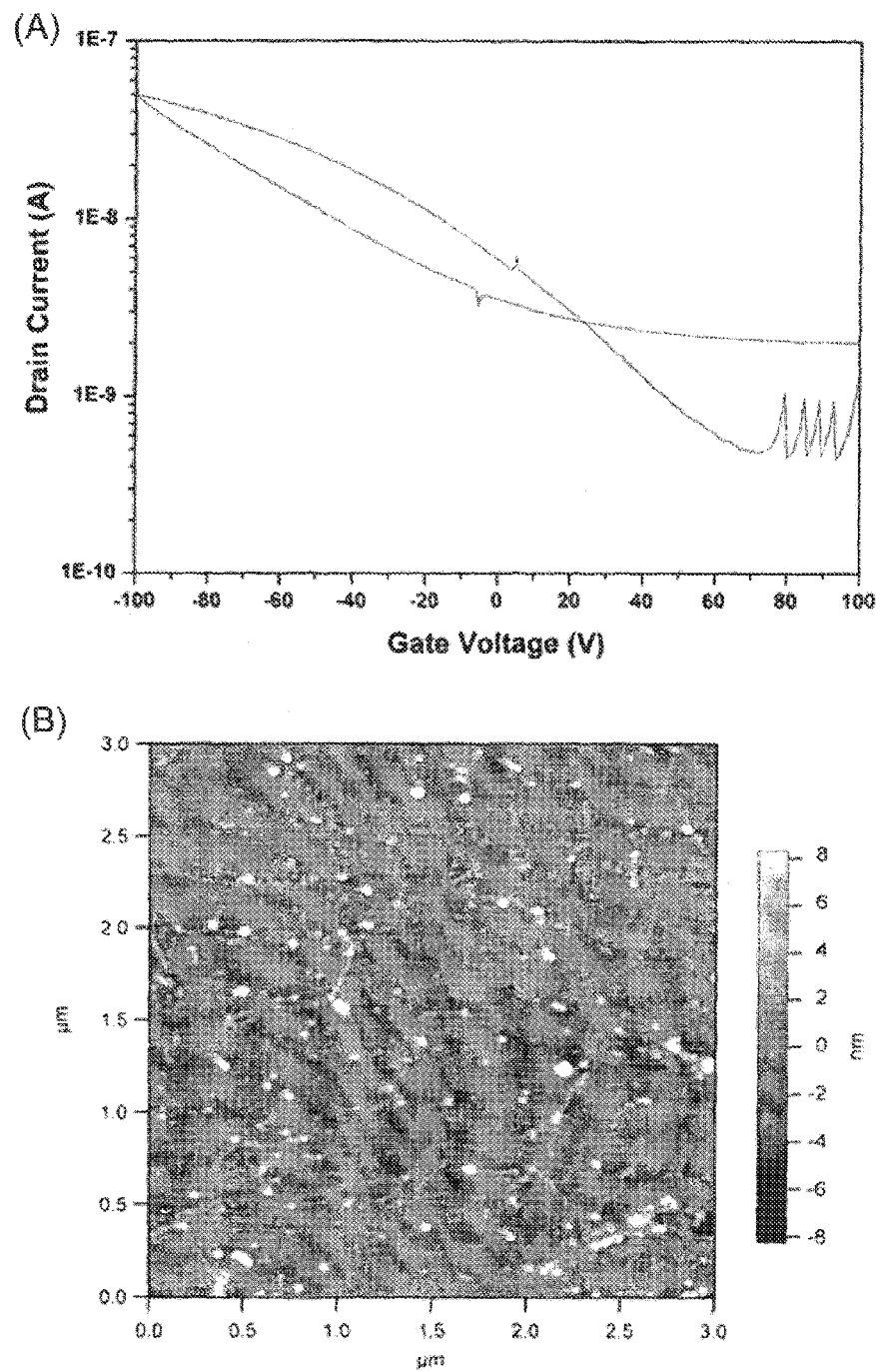
FIG. 15 shows SWNT network device using CS-A/CoMoCAT SWNTs. (A) A typical $V_g$-$A_d$ graph (the channel width is 50 μm and the length is 50 μm); (B) AFM image of the region between the electrodes; (C) histogram of percentage of number of devices with various on/off ratios. SDBS/CoMoCAT solution is used as the reference and the number of devices tested for CS-A/CoMoCAT and SDBS/CoMoCAT are 30 and 50, respectively.
Figure 15:
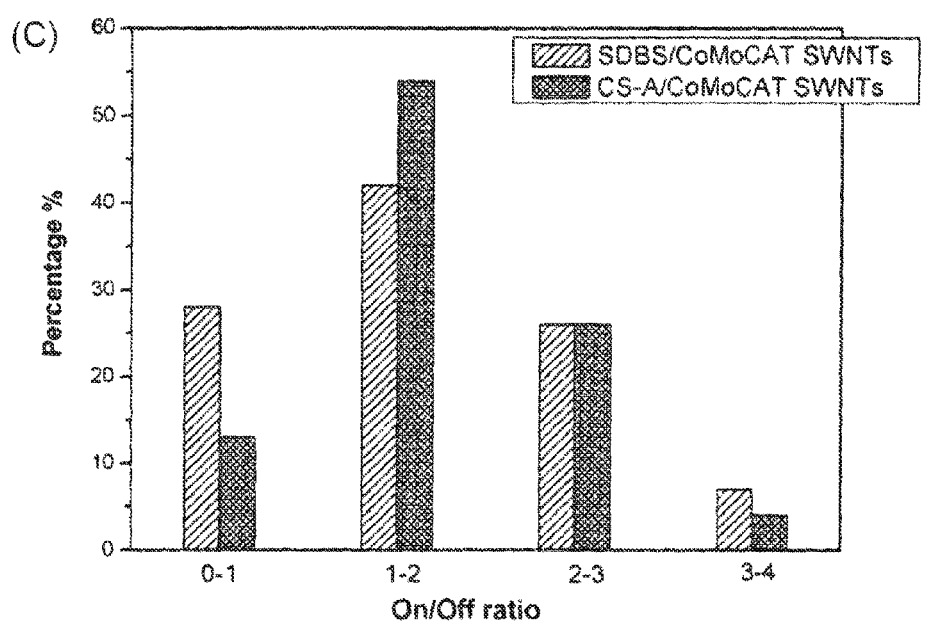

FIG. 15A shows the typical charge transfer properties of CS-A/CoMoCAT® solutions with forward and reverse sweeps of drain current ($I_d$) versus gate voltage ($V_g$) at constant drain voltage. FIG. 15C shows a histogram of the percentage of devices with different on/off ratios. Devices using CS-A CoMoCAT® have on/off ratios of $10^1$-$10^3$, similar to those made using SDBS/CoMoCAT®. AFM of the nanotubes in the channel between the electrodes (FIG. 15B) shows that CS-A has been mostly removed. The good solubility of CS-A in water (100 mg ml$^{-1}$), particularly in the presence of sodium counter-ions, is believed to cause its easy re-dissolution.

It has been found that CS-A and CS-C, in contrast to CS-B, polymers are good SWNT dispersants. The different spatial arrangements of the functional groups in the different isomers lead to different intramolecular interactions and polymer conformations, and hence differing nanotube dispersion efficacies. Weak intramolecular interaction, extended polymer conformation and a balance of hydrophobic and hydrophilic segments of an isomeric form of a polymer all contribute to good nanotube dispersibility. The present water-based CS dispersant disperses SWNTs as well as small molecular surfactants such as SDS and may find applications in biocompatible hydrogels or in some nanotube inks which need to have reasonably high surface tension, such as in inkjet printing, for example. The removal of dispersant/surfactant from nanotubes after dispersion is particularly important for electronic applications. Due to the presence of significant metallic species, better transistor-based device performance may be obtainable and improved by patterning the nanotube network to suitable width to decrease the percolation of metallic nanotubes.

By "comprising" it is meant including, but not limited to, whatever follows the word "comprising". Thus, use of the term "comprising" indicates that the listed elements are required or mandatory, but that other elements are optional and may or may not be present.

By "consisting of" is meant including, and limited to, whatever follows the phrase "consisting of". Thus, the phrase "consisting of" indicates that the listed elements are required or mandatory, and that no other elements may be present.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

By "about" in relation to a given numerical value, such as for temperature and period of time, it is meant to include numerical values within 10% of the specified value.

The invention has been described broadly and generically herein. Each of the narrower species and sub-generic groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

The invention claimed is:

1. A method for dispersing carbon nanotubes, comprising:
   (a) providing a solution containing chondroitin sulfate cation salt of formula (I)

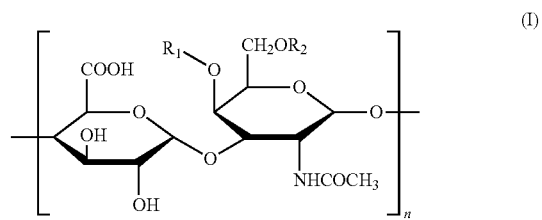

wherein
   $R_1$ is H and $R_2$ is $MSO_3$;
   M is an alkaline metal, or an alkaline earth metal further bound to a monovalent counter-anion;
   n is at least 20; and
   (b) contacting the carbon nanotubes with the solution containing the chondroitin sulfate cation salt, wherein the chondroitin sulfate cation salt is an A or C isomer.

2. The method of claim 1, wherein M is selected from the group consisting of sodium, potassium and calcium.

3. The method of claim 2, wherein M is sodium.

4. The method of claim 2, wherein M is calcium and the monovalent counter-anion is selected from the group consisting of chloride, bromide, iodide, chlorate, nitrate and nitrite.

5. The method of claim 1, wherein the carbon nanotubes are single-walled carbon nanotubes.

6. The method of claim 1, wherein contacting comprises agitating the mixture of carbon nanotubes and the solution by sonication.

7. The method of claim 1, further comprising centrifuging the mixture of carbon nanotubes and the solution to separate the dispersed carbon nanotubes from the mixture.

8. A carbon nanotube having a chondroitin sulfate cation salt attached thereto, wherein the chondroitin sulfate cation salt has formula (I)

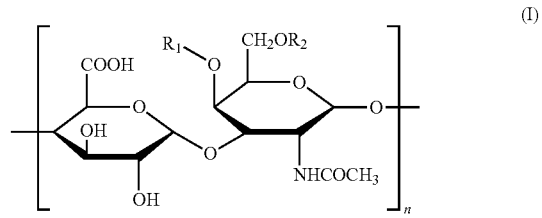

wherein
   $R_1$ is H and $R_2$ is $MSO_3$;
   M is an alkaline metal, or an alkaline earth metal further bound to a monovalent counter-anion;
   n is at least 20,
wherein the chondroitin sulfate cation salt is an A or C isomer.

9. The carbon nanotube of claim 8, wherein M is selected from the group consisting of sodium, potassium and calcium.

10. The carbon nanotube of claim 9, wherein M is sodium.

11. The carbon nanotube of claim 9, wherein M is calcium and the monovalent counter-anion is selected from the group consisting of chloride, bromide, iodide, chlorate, nitrate and nitrite.

12. The carbon nanotube of claim 8, wherein the carbon nanotubes are single-walled carbon nanotubes.

13. A field-effect transistor comprising a carbon nanotube having a chondroitin sulfate cation salt attached thereto, wherein the chondroitin sulfate cation salt has formula (I)

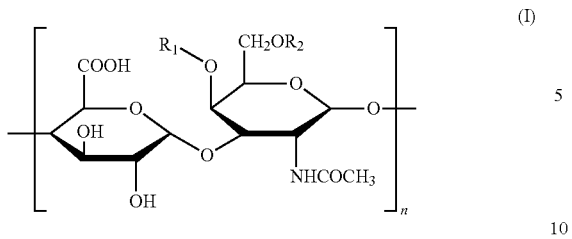 (I)

wherein
$R_1$ is H and $R_2$ is $MSO_3$;
M is an alkaline metal, or an alkaline earth metal further bound to a monovalent counter-anion;
n is at least 20,
wherein the chondroitin sulfate cation salt is an A or C isomer.

14. The field-effect transistor of claim 13 wherein M is selected from the group consisting of sodium, potassium and calcium.

15. The field-effect transistor of claim 14, wherein M is sodium.

16. The field-effect transistor of claim 14, wherein M is calcium and the monovalent counter-anion is selected from the group consisting of chloride, bromide, iodide, chlorate, nitrate and nitrite.

17. The method of claim 1 wherein the chondroitin sulfate cation salt wraps around or attaches to a surface of individual carbon nanotubes.

\* \* \* \* \*